US012651981B2

(12) United States Patent
Song et al.

(10) Patent No.: US 12,651,981 B2
(45) Date of Patent: Jun. 9, 2026

(54) ENERGY HARVESTER AND DISPLAY APPARATUS INCLUDING THE SAME

(71) Applicant: LG Display Co., Ltd., Seoul (KR)

(72) Inventors: Myungeun Song, Paju-si (KR); JunHa Hwang, Paju-si (KR); JaeChul Hwang, Paju-si (KR); HyeRan Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 925 days.

(21) Appl. No.: 17/882,514

(22) Filed: Aug. 5, 2022

(65) Prior Publication Data

US 2023/0188059 A1 Jun. 15, 2023

(30) Foreign Application Priority Data

Dec. 9, 2021 (KR) ........................ 10-2021-0175874

(51) Int. Cl.
*H02N 2/00* (2006.01)
*H02N 2/18* (2006.01)
*H10N 35/00* (2023.01)

(52) U.S. Cl.
CPC ........... *H02N 2/186* (2013.01); *H10N 35/101* (2023.02)

(58) Field of Classification Search
CPC ........ H02N 2/186; H02N 2/18; H10N 35/101; H10N 30/30; H10N 35/00
See application file for complete search history.

(56) References Cited

U.S. PATENT DOCUMENTS

2022/0407401 A1* 12/2022 Parida .................... H02K 35/02

FOREIGN PATENT DOCUMENTS

| | | | | |
|---|---|---|---|---|
| CN | 108023501 A | * | 5/2018 | ............. H02N 2/186 |
| CN | 109639088 A | | 4/2019 | |
| CN | 112260582 A | | 1/2021 | |
| CN | 112821708 A | * | 5/2021 | ............. H02N 2/186 |
| CN | 113489121 A | | 10/2021 | |
| JP | 2011-166894 A | | 8/2011 | |
| KR | 10-2013-0033223 A | | 4/2013 | |
| KR | 10-2021-0077419 A | | 6/2021 | |

OTHER PUBLICATIONS

Zhang et al., "Magnetically levitated/piezoelectric/triboelectric hybrid generator as a power supply for the temperature sensor," Science China Technological Sciences, Jul. 2017, vol. 60, No. 7, pp. 1068-1074.

* cited by examiner

*Primary Examiner* — Julio C. Gonzalez
(74) *Attorney, Agent, or Firm* — Morgan, Lewis & Bockius LLP

(57) ABSTRACT
An energy harvester includes a housing including an inner space holed in a lengthwise direction, a first magnet portion disposed at a center portion of the inner space of the housing, a second magnet portion spaced apart from the first magnet portion in the inner space, the second magnet portion including a first surface having a magnetic repulsive force with the first magnet portion, and a power generating device part disposed on a second surface of the second magnet portion and configured to generate electrical energy based on deformation thereof.

23 Claims, 13 Drawing Sheets

350 420 331 321 341 430 360   111

301d 331 321 341 420 350 430 361 351 371

301e

301a 331    321    341

301b 331 321 341 420 350

301c 350 420 331 321 341

301d 350 420 331 321 341 430 360

301e 331 321 341 420 350 430 361 351 371

I-I'

I-I'

I-I'

I-I'

ENERGY HARVESTER AND DISPLAY APPARATUS INCLUDING THE SAME

CROSS-REFERENCE TO RELATED APPLICATIONS

This application claims the benefit of the Korean Patent Application No. 10-2021-0175874 filed on Dec. 9, 2021, which is hereby incorporated by reference as if fully set forth herein.

BACKGROUND

Technical Field

The present disclosure relates to an energy harvester and a display apparatus including the same.

Discussion of the Related Art

Energy harvesting denotes technology which collects peripheral energies, which are not used and are wasted, and converts the collected energies into electrical energy. Recently, the energy harvesting may solve an environment problem which is a representative example of the greenhouse effect, based on the era of low carbon green growth and is attracting much attention as a representative clean energy system capable of coping with the era of high oil price.

Energy harvesting technology may be implemented based on various principles such as a piezoelectric effect, a photovoltaic effect, and a thermoelectric effect. Technology using a device having a piezoelectric characteristic among the effects is being actively researched.

In devices using the piezoelectric effect, when an external force or vibration is applied to a piezoelectric material, a mechanical stress or deformation occurs to generate an electric charge, and energy harvesters for self-generating energy based on an external force or vibration may be implemented.

SUMMARY

Accordingly, embodiments of the present disclosure are directed to an energy harvester and a display apparatus including the same that substantially obviate one or more problems due to limitations and disadvantages of the related art.

An aspect of the present disclosure is to provide an energy harvester and a display apparatus including the same, which may generate electrical energy with an electrical field and may enhance an efficiency of generating electrical energy based on an external vibration by a magnetic repulsive force between permanent magnets.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an energy harvester comprises a housing including an inner space holed in a lengthwise direction, a first magnet portion disposed at a center portion of the inner space of the housing, a second magnet portion spaced apart from the first magnet portion in the inner space, the second magnet portion including a first surface having a magnetic repulsive force with the first magnet portion, and a power generating device part disposed on a second surface of the second magnet portion and configured to generate electrical energy based on deformation thereof.

In another aspects, a display apparatus comprises a display panel, a vibration generating apparatus disposed in the display panel, the vibration generating apparatus including at least one vibration module vibrating the display panel, an energy harvester disposed in a vibration region of the display panel, and an energy device supplied with electrical energy generated by the energy harvester.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate aspects and embodiments of the disclosure and together with the description serve to explain principles of the disclosure.

Figure 1:
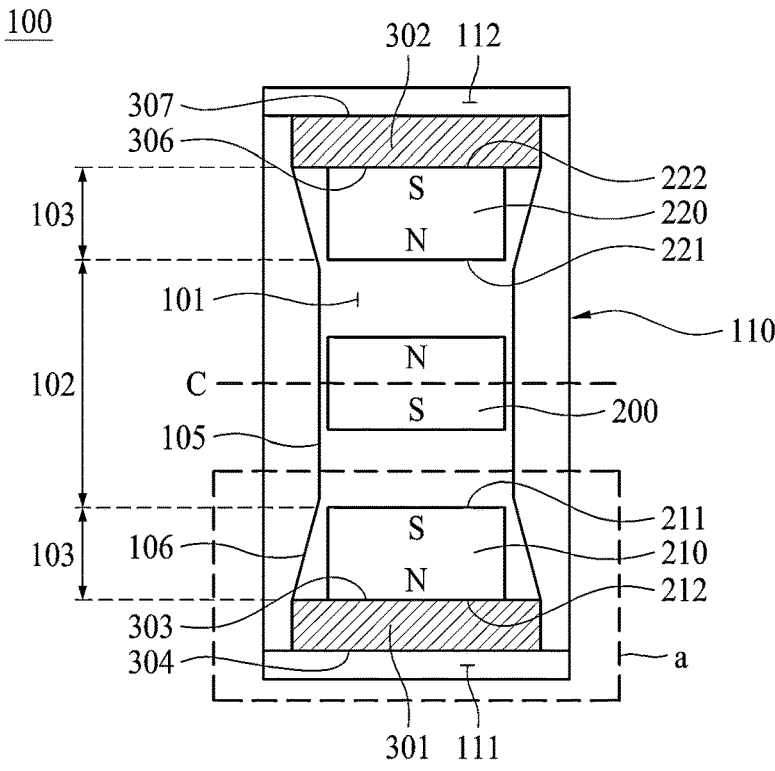
FIG. 1 is a cross-sectional view of an energy harvester according to various embodiments of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations may unnecessarily obscure aspects of the present disclosure, the detailed description thereof may be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals refer to like elements throughout unless stated otherwise. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and completely convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, embodiments of the present disclosure are not limited to the illustrated details. Like reference numerals refer to like elements throughout the specification. In the following description, when the detailed description of the relevant known function or configuration is determined to unnecessarily obscure the important point of the present disclosure, the detailed description will be omitted.

When the terms "comprise," "have," and "include," "contain," "constitute," "make up of," "formed of," and the like are used, one or more other elements may be added unless the term, such as "only" is used. The terms of a singular form may include plural forms unless the context clearly indicates otherwise.

In construing an element, the element is construed as including an error range even where no explicit description is provided.

In describing a position relationship, for example, when the position relationship is described using "on," "over," "under," "above," "below," "beneath," "near," "close to," or "adjacent to," "beside," "next to," or the like, one or more portions may be arranged between two other portions unless a more limiting term, such as "immediate(ly)," "direct(ly)," or "close(ly)" is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which a third structure is disposed or interposed therebetween. Furthermore, the terms "front," "rear," "left," "right," "top,"

"bottom," "downward," "upward," "upper," "lower," and the like refer to an arbitrary frame of reference.

In describing a temporal relationship, for example, when the temporal order is described as "after," "subsequent," "next," "before," "prior to," or the like, a case which is not continuous may be included unless a more limiting term, such as "just," "immediate(ly)," or "direct(ly)" is used.

It will be understood that, although the terms "first," "second," "A," "B," "(a)," "(b)," or the like may be used herein to describe various elements, these elements should not be limited by these terms. These terms are only used to partition one element from another. For example, a first element could be termed a second element, and, similarly, a second element could be termed a first element, without departing from the scope of the present invention.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a preferred embodiment of an energy harvester and a display apparatus including the same according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

FIG. 1 is a cross-sectional view of an energy harvester according to various embodiments of the present disclosure.

Referring to FIG. 1, the energy harvester 100 according to various embodiments of the present disclosure may include a housing 110, a first magnet portion 200, second magnet portions 210 and 220, and power generating device parts 301 and 302.

The housing 110 may include an inner space 101 which is holed in a lengthwise direction and a body portion which surrounds the inner space 101. For example, the body portion of the housing 110 may include a body frame portion, which surrounds the inner space 101 holed in the lengthwise direction, and one cover portion and the other cover portion which respectively close one side and the other side with the holed inner space 101 therebetween. For example, the body frame portion may have a cylindrical shape, but embodiments of the present disclosure are not limited thereto. The housing 110 may include an acrylonitrile butadiene styrene (ABS) plastic material, but embodiments of the present disclosure are not limited thereto. For example, the housing 110 may be rectangular parallelepiped or cylindrical in whole shape of an external appearance, but embodiments of the present disclosure are not limited thereto.

The first magnet portion 200 may be disposed at a center portion C of the inner space 101 of the housing 110. The first magnet portion 200 may be a permanent magnet having ferromagnetism. For example, the first magnet portion 200 may be a permanent magnet including a neodymium-iron-boron alloy (NdFeB) component, but embodiments of the present disclosure are not limited thereto. The first magnet portion 200 may move in the lengthwise direction in the inner space 101 of the housing 110. The first magnet portion 200 may vibrate in the lengthwise direction of the inner space 101 based on an external vibration, in the inner space 101. The first magnet portion 200 may have an S pole formed at one side thereof in the lengthwise direction and an N pole formed at the other side thereof in the lengthwise direction. Alternatively, the first magnet portion 200 may have an N pole formed at the one side thereof in the lengthwise direction and an S pole formed at the other side thereof in the lengthwise direction. For example, the first magnet portion 200 may be a center magnet portion, but embodiments of the present disclosure are not limited thereto.

The first magnet portion 200 may correspond to a shape of the inner space 101 of the housing 110. For example, the first magnet portion 200 may include an S pole or an N pole formed in one direction of the inner space 101 of the housing 110, or may include an N pole or an S pole formed in the other direction of the inner space 101. For example, the first magnet portion 200 may have a plate shape, but embodiments of the present disclosure are not limited thereto. For example, when the inner space 101 of the housing 110 has a circular shape in a widthwise direction, the first magnet portion 200 may be formed in a circular plate shape, but embodiments of the present disclosure are not limited thereto. For example, when the inner space 101 of the housing 110 has a tetragonal shape in the widthwise direction, the first magnet portion 200 may be formed in a tetragonal plate shape, but embodiments of the present disclosure are not limited thereto.

The second magnet portions 210 and 220 may be spaced apart from the first magnet portion 200, in the inner space 101 of the housing 110. The second magnet portions 210 and 220 may be a permanent magnet having ferromagnetism. For example, the second magnet portions 210 and 220 may be a permanent magnet including NdFeB component, but embodiments of the present disclosure are not limited thereto. The second magnet portions 210 and 220 may be disposed to have a magnetic repulsive force with respect to the first magnet portion 200. The second magnet portions 210 and 220 may be spaced apart from the first magnet portion 200. For example, the second magnet portions 210 and 220 and the first magnet portion 200 may maintain a distance (or a separation distance) therebetween based on a magnetic repulsive force therebetween. When the first magnet portion 200 vibrates based on an external vibration in the inner space 101, the second magnet portions 210 and 220 may be supplied with a vibration of the first magnet portion 200 based on the magnetic repulsive force with the first magnet portion 200. For example, the second magnet portions 210 and 220 may each be an external magnet, but the terms are not limited thereto.

Each of the second magnet portions 210 and 220 may have an S pole formed at one side thereof in the lengthwise direction of the inner space 101 and an N pole formed at the other side thereof in the lengthwise direction. Alternatively, each of the second magnet portions 210 and 220 may have an N pole formed at the one side thereof in the lengthwise direction of the inner space 101 and an S pole formed at the other side thereof in the lengthwise direction.

The second magnet portions 210 and 220 may be implemented to have the same pole as that of the first magnet portion 200 so that a pole of a first surface thereof facing the first magnet portion 200 has the magnetic repulsive force with the first magnet portion 200. For example, when a pole of the first magnet portion 200 facing the second magnet portions 210 and 220 is an N pole, a pole of a corresponding first surface may be formed as an N pole, and when a pole of the first magnet portion 200 facing the second magnet portions 210 and 220 is an S pole, a pole of a corresponding first surface may be formed as an S pole.

The second magnet portions 210 and 220 may correspond to a shape of the inner space 101 of the housing 110. For example, the second magnet portions 210 and 220 may include an S pole or an N pole formed in one direction of the inner space 101 of the housing 110, or may include an N pole or an S pole formed in the other direction of the inner space 101. For example, the second magnet portions 210 and 220 may have a plate shape, but embodiments of the present disclosure are not limited thereto. The second magnet portions 210 and 220 may have the same shape as that of the first magnet portion 200, but embodiments of the present disclosure are not limited thereto.

The inner space 101 of the housing 110 may include a first region 102, where the first magnet portion 200 is disposed at a center portion C thereof and first surfaces of the second magnet portions 210 and 220 disposed apart from the first magnet portion 200 is provided, and a second region 103 where the second magnet portions 210 and 220 are disposed. The second region 103 of the inner space 101 may be formed so that an inner space thereof is progressively widened in a direction distancing from the first region 102. For example, a distance between inner surfaces 105 of the first region 102 of the inner space 101 may be equal, and the second region 103 of the inner space 101 may include a slope surface 106 including an inner space which is progressively widened in a direction distancing from the first region 102. For example, the first region 102 may be a center region, but the terms are not limited thereto. For example, the second region 103 may be an outer region, but the terms are not limited thereto.

The first magnet portion 200 may be disposed in the first region 102 in the inner space 101 of the housing 110 and may have a width which is less than a distance between the inner surfaces 105 of the first region 102. The first magnet portion 200 may be disposed in the first region 102 based on a magnetic repulsive force with the second magnet portions 210 and 220, in the inner space 101 of the housing 110. The first magnet portion 200 may be disposed between the second magnet portions 210 and 220 in the inner space 101 of the housing 110 and may maintain a magnetic levitation state having a certain separation distance based on the magnetic repulsive force with the second magnet portions 210 and 220 respectively disposed at both sides. For example, the first magnet portion 200 may be spaced apart from the second magnet portions 210 and 220.

The second magnet portions 210 and 220 may be disposed in the second region 103 in the inner space 101 of the housing 110 and may have the same shape as that of the first magnet portion 200. The second magnet portions 210 and 220 may each include a first surface which is disposed in the first region 102 in the inner space 101 of the housing 110 and a lateral surface and a second surface which are disposed in the second region 103. For example, the first surface of each of the second magnet portions 210 and 220 may be disposed at a boundary surface between the first region 102 and the second region 103 of the housing 110, and the lateral surface and the second surface of the second magnet portions 210 and 220 may be disposed in the second region 103.

The first magnet portion 200 may be disposed in the first region 102 of the inner space 101 based on the magnetic repulsive force with the second magnet portions 210 and 220, and when an external vibration occurs, the first magnet portion 200 may freely move in the first region 102 based on the external vibration to vibrate. When the first magnet portion 200 vibrates, the second magnet portions 210 and 220 may be supplied with a vibration of the first magnet portion 200 based on a magnetic repulsive force with the first magnet portion 200 and may be disposed in the second region 103 including the slope surface 106 including an inner space which is progressively widened in a direction distancing from the first region 102, and thus, even when an irregular vibration is transferred, because there is no friction with the slope surface 106 of the second region 103, a force based on a vibration may be effectively transferred to the power generating device parts 301 and 302.

The power generating device parts (or electricity generating device parts) 301 and 302 may each be an energy harvesting device for generating electrical energy based on deformation. The power generating device parts 301 and 302 may be disposed on second surfaces of the second magnet portions 210 and 220. The power generating device parts 301 and 302 may be disposed at the second surfaces of the second magnet portions 210 and 220 (for example, second surfaces opposite to first surfaces of the second magnet portions 210 and 220 facing the first magnet portion 200) and may be coupled or connected to one side or the other side of an inner portion of the housing 110. The power generating device parts 301 and 302 may be deformed by a force applied by the second magnet portions 210 and 220. The power generating device parts 301 and 302 may vibrate based on an external vibration in the inner space 101 of the housing 110, and when a vibration of the first magnet portion 200 is transferred to the second magnet portions 210 and 220 by a magnetic repulsive force, the power generating device parts 301 and 302 may be deformed by a force applied based on a vibration transferred to the second magnet portions 210 and 220. The power generating device parts 301 and 302 may have a width which is wider than the second magnet portions 210 and 220. Accordingly, a force applied by the second magnet portions 210 and 220 may more concentrate on the power generating device parts 301 and 302 and may be transferred, and thus, deformation of the power generating device parts 301 and 302 may further increase.

The power generating device parts 301 and 302 may include a first power generating device part 301 disposed at one side 111 of the housing 110 and a second power generating device part 302 disposed at the other side 112 of the housing 110. The first magnet portion 200 may be disposed between the first power generating device part 301 and the second power generating device part 302. A 2-$1^{st}$ magnet portion 210 may be disposed between the first power generating device part 301 and the first magnet portion 200, and a 2-$2^{nd}$ magnet portion 220 may be disposed between the second power generating device part 302 and the first magnet portion 200.

The first and second power generating device parts 301 and 302 may be accommodated into the housing 110, and the inner space 101 of the housing 110 may be formed between the first and second power generating device parts 301 and 302 in the housing 110. The first magnet portion 200 may be disposed at a center portion C of the inner space 101 of the housing 110. The 2-$1^{st}$ magnet portion 210 may be disposed between the first power generating device part 301 and the first magnet portion 200 in the inner space 101 of the housing 110. The 2-$2^{nd}$ magnet portion 220 may be disposed between the second power generating device part 302 and the first magnet portion 200 in the inner space 101 of the housing 110.

A first surface 303 of the first power generating device part 301 may be coupled or connected to a second surface 212 of the 2-$1^{st}$ magnet portion 210, and a second surface 304 of the first power generating device part 301 may be coupled or connected to one side 111 of the housing 110. For example, an adhesive member may be disposed between the first surface 303 of the first power generating device part 301 and the second surface 212 of the 2-$1^{st}$ magnet portion 210. The first surface 303 of the first power generating device part 301 and the second surface 212 of the 2-$1^{st}$ magnet portion 210 may be adhered and coupled (or connected) to each other by an adhesive member. The first power generating device part 301 may be inserted into and fixed to an inner portion of the housing 110, and the one side 111 of the housing 110 may be coupled or connected and fixed to a second surface 304 of the first power generating device part 301 to close the inner portion of the housing 110. According to another embodiment of the present disclosure, the first power generating device part 301 may be fixed to the one side 111 of the housing 110 having a cover shape which closes the inner portion of the housing 110 and the one side 111 of the housing 110 and the first power generating device part 301 may be inserted (or accommodated) into the housing 110, and thus, may be coupled or connected and fixed to the inner portion of the housing 110.

A first surface 306 of the second power generating device part 302 may be coupled or connected to a second surface 222 of the 2-$2^{nd}$ magnet portion 220, and a second surface 306 of the second power generating device part 302 may be coupled or connected to the other side 112 of the housing 110. For example, an adhesive member may be disposed between the first surface 306 of the second power generating device part 302 and the second surface 222 of the 2-$2^{nd}$ magnet portion 220. The first surface 306 of the second power generating device part 302 and the second surface 222 of the 2-$2^{nd}$ magnet portion 220 may be adhered and coupled (or connected) to each other by an adhesive member. The second power generating device part 302 may be inserted into and fixed to the inner portion of the housing 110, and the other side 112 of the housing 110 may be coupled or connected and fixed to a second surface 306 of the second power generating device part 302 to close the inner portion of the housing 110. According to another embodiment of the present disclosure, the second power generating device part 302 may be fixed to the other side 112 of the housing 110 having a cover shape which closes the inner portion of the housing 110 and the other side 112 of the housing 110 and the second power generating device part 302 may be inserted into the housing 110, and thus, may be coupled or connected and fixed to the inner portion of the housing 110.

The first power generating device part 301 and the second power generating device part 302 may be configured with an energy harvesting device having the same structure. Alternatively, the first power generating device part 301 and the second power generating device part 302 may be configured with energy harvesting devices having different structures. The energy harvesting device may generate electrical energy based on deformation. For example, the energy harvesting device may include a piezoelectric material which is a material having the piezoelectric effect. The piezoelectric effect may be a phenomenon where a voltage is generated when deformation caused by pressure is applied to a piezoelectric material, and deformation occurs when a voltage is applied. For example, the energy harvesting device may include at least one piezoelectric member including a piezoelectric material and may generate electrical energy based on deformation of the piezoelectric member. Alternatively, the energy harvesting device may include a magnetostriction material where a magnetostriction phenomenon occurs. The magnetostriction phenomenon may be a phenomenon where a shape of a magnetic element is changed when a ferromagnetic element is magnetized by a magnetic field. For example, the energy harvesting device may include at least one magnetostriction member including a magnetostriction material which expands or contracts in a horizontal or vertical direction based on at least one piezoelectric member and a magnetic field, and the piezoelectric member may be deformed by deformation of the magnetostriction member caused by a magnetic field and may generate electrical energy based on the deformation of the piezoelectric member. Also, the energy harvesting device may include at least one magnetostriction material, and thus, may complement vulnerability of ceramic where the piezoelectric member is easily fragile. The first and second power generating device parts 301 and 302 using the energy harvesting device will be described below in more detail with reference to FIGS. 2A to 3E.

FIGS. 2A to 2E are enlarged cross-sectional views of a region a of FIG. 1 and illustrate an energy harvester according to various embodiments of the present disclosure, and FIGS. 3A to 3E are perspective views illustrating a power generating device part of an energy harvester according to various embodiments of the present disclosure. In FIGS. 2A to 2E, for convenience of description, only first power generating device parts 301a to 301e disposed at one side 111 of a housing 110 are illustrated, but a second power generating device part 302 disposed at the other side 112 of the housing 110 may differ in only position and direction and may have substantially the same configuration. Therefore, a repeated description of the second power generating device part 302 may be omitted.

With reference to FIGS. 2A to 3E, an energy harvester 100 according to various embodiments of the present disclosure may include power generating device parts (or first power generating device parts) 301a to 301e which generate electrical energy based on deformation. The power generating device parts 301a to 301e may include at least one piezoelectric member, or may include at least one piezoelectric member and at least one magnetostriction member.

Figure 2A:
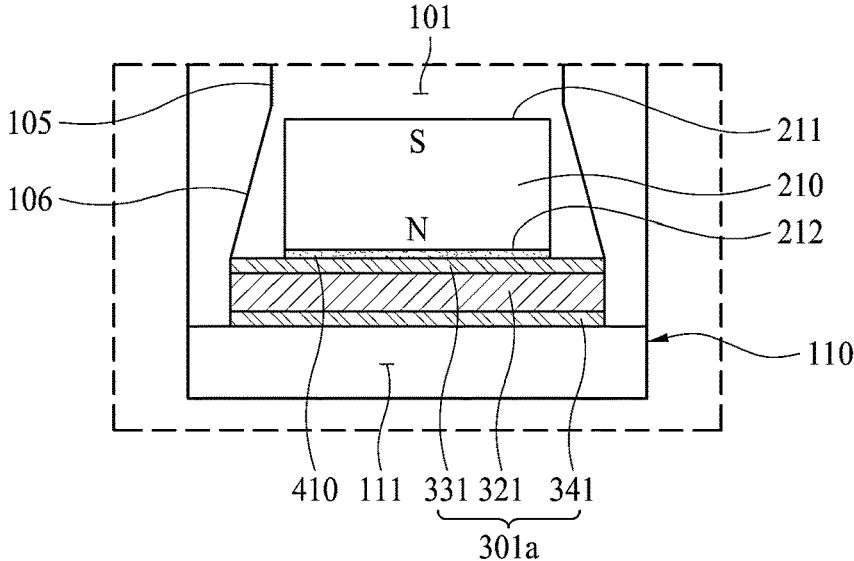
FIGS. 2A to 2E are enlarged cross-sectional views of a region a of FIG. 1 and illustrate an energy harvester according to various embodiments of the present disclosure.
Figure 3A:
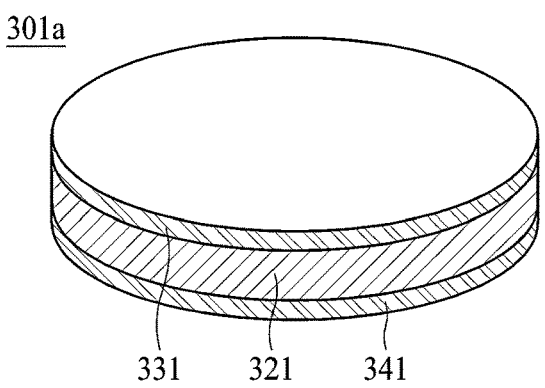
FIGS. 3A to 3E are perspective views illustrating a power generating device part of an energy harvester according to various embodiments of the present disclosure.

Referring to FIGS. 2A and 3A, an energy harvester 100 according to various embodiments of the present disclosure may include a power generating device part 301a.

The power generating device part 301a according to an embodiment of the present disclosure may be disposed at one side 111 of a housing 110. The power generating device part 301a may be disposed on a second surface of a second magnet portion (or a 2-1$^{st}$ magnet portion). The power generating device part 301a may be disposed on a second surface 212 of the second magnet portion, and for example, the second magnet portion 210 may be disposed on the second surface 212 opposite to a first surface 211 facing a first magnet portion (for example, the first magnet portion 200 of FIG. 1) and may be coupled or connected to the one side 111 of an inner portion of the housing 110. The power generating device part 301a may be deformed by a force applied by the second magnet portion 210. When the first magnet portion 200 vibrates based on an external vibration in an inner space 101 of the housing 110 and a vibration of the first magnet portion 200 is transferred to the second magnet portion 210 by a magnetic repulsive force, the power generating device part 301a may be deformed by a force applied based on a vibration transferred to the second magnet portion 210. The power generating device part 301a may have an area which is greater than that of the second magnet portion 210. Accordingly, a force applied by the second magnet portion 210 may more concentrate on the power generating device part 301a and may be transferred, and thus, a deformation of the power generating device part 301a may further increase.

The power generating device part 301a may be a piezoelectric member including a piezoelectric material having a piezoelectric effect. The power generating device part (or a piezoelectric member) 301a may include a first electrode layer 331, a piezoelectric material layer 321 disposed on the first electrode layer 331, and a second electrode layer 341 disposed on the piezoelectric material layer 321.

In the power generating device part 301a, as illustrated in FIG. 3A, the first electrode layer 331, the piezoelectric material layer 321, and the second electrode layer 341 may be sequentially stacked. For example, the power generating device part 301a may have a circular plate shape. In an embodiment of the present disclosure, a shape of the power generating device part 301a is not limited thereto. For example, the power generating device part 301a may have various shapes such as a tetragonal shape or a ring shape or the like.

The first electrode layer 331 of the power generating device part 301a may be disposed on a second surface 212 of the second magnet portion 210. A first adhesive layer (or an adhesive member) 410 may be disposed between the first electrode layer 331 of the power generating device part 301a and the second surface 212 of the second magnet portion 210. The first electrode layer 331 may be attached on and coupled (or connected) to the second surface 212 of the second magnet portion 210 by the first adhesive layer 410. The first adhesive layer 410 may include an adhesive or a double-sided tape, but embodiments of the present disclosure are not limited thereto. For example, the first adhesive layer 410 may include one of epoxy, acryl, silicone, and urethane, but embodiments of the present disclosure are not limited thereto. For example, the first adhesive layer 410 may further include an additive such as a hardener, a tackifier, a wax component, or an antioxidant or the like.

The first electrode layer 331 may function as one of an anode or a cathode of the piezoelectric material layer 321. For example, the first electrode layer 331 may be an anode. For example, the first electrode layer 331 may include one of silver (Ag), copper (Cu), gold (Au), and aluminum (Al) or a combination thereof, but embodiments of the present disclosure are not limited thereto. The first electrode layer 331 may be formed by coating or forming a paste of an electrode material on the piezoelectric material layer 321.

The piezoelectric material layer 321 of the power generating device part 301a may be disposed on the first electrode layer 331. Also, the piezoelectric material layer 321 of the power generating device part 301a may be disposed on the second electrode layer 341. For example, the piezoelectric material layer 321 may be disposed between the first electrode layer 331 and the second electrode layer 341. The piezoelectric material layer 321 may include one of lead zirconate titanate (PZT), lead magnesium niobate-lead titanate (PMN—PT), lead zirconate niobate-lead titanate (PZN—PT), microfiber composites (MFC), BaTiO₃, a ceramic material such as a Na—K—Nb (NKN)-based material, and a polymer material such as polyvinylidene fluoride (PVDF), but embodiments of the present disclosure are not limited thereto. For example, when the piezoelectric material layer 321 includes MFC, MFC may have a ductile and flexible characteristic by fiberizing ceramic, and thus, vulnerability of fragile ceramic may be complemented and an output of generating electrical energy may be enhanced.

The second electrode layer 341 of the power generating device part 301a may be disposed on the piezoelectric material layer 321. The second electrode layer 341 of the power generating device part 301a may be coupled or connected to the one side 111 of the housing 110. The second electrode layer 341 may be coupled or connected and fixed to the one side 111 of the housing 110 in a form where the one side 111 of the housing 110 closes the inner portion of the housing 110. Alternatively, the second electrode layer 341 may be attached on and fixed to the one side 111 of the housing 110 having a cover shape which closes the inner portion of the housing 110.

The second electrode layer 341 may function as one of an anode or a cathode of the piezoelectric material layer 321. For example, the second electrode layer 341 may be a cathode. For example, the second electrode layer 341 may include one of Ag, Cu, Au, and Al or a combination thereof, but embodiments of the present disclosure are not limited thereto. The second electrode layer 341 may include the same material as that of the first electrode layer 331, or may include a different material. The second electrode layer 341 may be formed by coating a paste of an electrode material on the piezoelectric material layer 321.

Figure 2B:
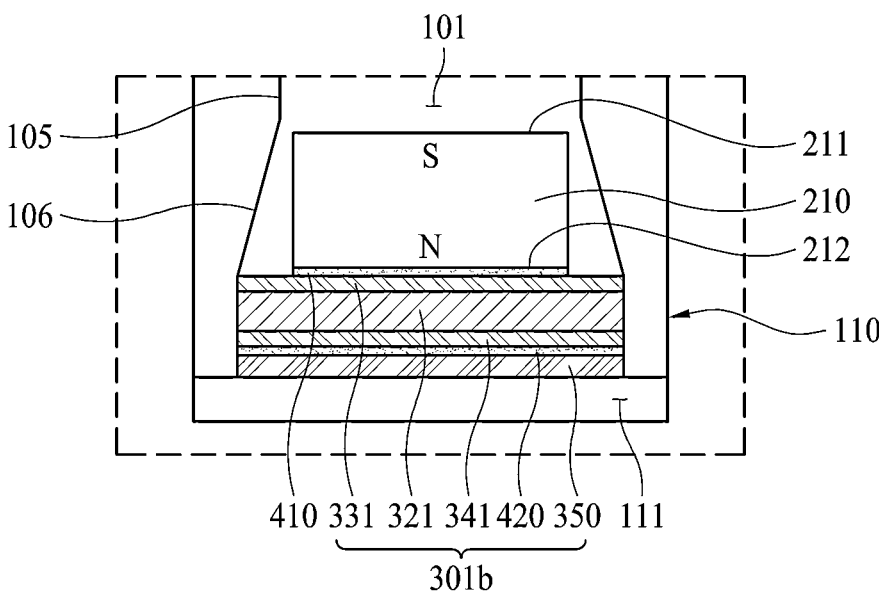
Figure 3B:
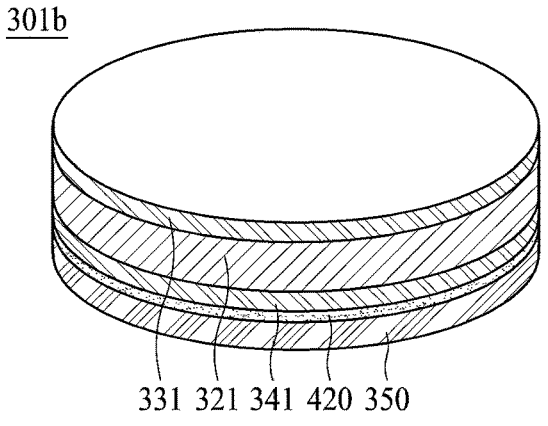

Referring to FIGS. 2B and 3B, an energy harvester 100 according to various embodiments of the present disclosure may include a power generating device part 301b. Except for that a configuration of the power generating device part 301b differs, the energy harvester 100 of FIG. 2B may be substantially the same as the energy harvester 100 of FIG. 2A, and thus, repeated descriptions are omitted.

The power generating device part 301b according to an embodiment of the present disclosure may have a structure where a piezoelectric member is coupled to a magnetostriction member including a magnetostriction material which is a material where the magnetostriction phenomenon occurs. The power generating device part 301b may be stacked in a structure where the magnetostriction member is disposed between the piezoelectric member and one side 111 of a housing 110. The power generating device part 301b may include a first electrode layer 331, a piezoelectric material layer 321 disposed on the first electrode layer 331, a second electrode layer 341 disposed on the piezoelectric material layer 321, a second adhesive layer 420 disposed on the second electrode layer 341, and a magnetostriction material layer (or a magnetostriction member) 350 disposed on the second adhesive layer 420.

In the power generating device part 301b, as illustrated in FIG. 3B, the first electrode layer 331, the piezoelectric material layer 321, the second electrode layer 341, the second adhesive layer 420, and the magnetostriction material layer 350 may be sequentially stacked. For example, the power generating device part 301b may have a circular plate shape. In the present disclosure, a shape of the power generating device part 301b is not limited thereto. For example, the power generating device part 301b may have various shapes such as a tetragonal shape or a ring shape.

The first electrode layer 331 of the power generating device part 301b may be disposed on a second surface 212 of the second magnet portion 210. A first adhesive layer (or an adhesive member) 410 may be disposed between the first electrode layer 331 of the power generating device part 301b and the second surface 212 of the second magnet portion 210. The first electrode layer 331 may be attached on and coupled (or connected) to the second surface 212 of the second magnet portion 210 by the first adhesive layer 410. The first adhesive layer 410 may include an adhesive or a double-sided tape, but embodiments of the present disclosure are not limited thereto. For example, the first adhesive layer 410 may include one of epoxy, acryl, silicone, and urethane, but embodiments of the present disclosure are not limited thereto. For example, the first adhesive layer 410 may further include an additive such as a hardener, a tackifier, a wax component, or an antioxidant.

The first electrode layer 331 may function as one of an anode or a cathode of the piezoelectric material layer 321. For example, the first electrode layer 331 may be an anode. For example, the first electrode layer 331 may include one of silver (Ag), copper (Cu), gold (Au), and aluminum (Al) or a combination thereof, but embodiments of the present disclosure are not limited thereto. The first electrode layer 331 may be formed by coating a paste of an electrode material on the piezoelectric material layer 321.

The piezoelectric material layer 321 of the power generating device part 301b may be disposed on the first electrode layer 331. Also, the piezoelectric material layer 321 of the power generating device part 301b may be disposed on the second electrode layer 341. For example, the piezoelectric material layer 321 may be disposed between the first electrode layer 331 and the second electrode layer 341. The piezoelectric material layer 321 may include one of lead zirconate titanate (PZT), lead magnesium niobate-lead titanate (PMN—PT), lead zirconate niobate-lead titanate (PZN—PT), microfiber composites (MFC), BaTiO₃, a ceramic material such as a Na—K—Nb (NKN)-based material, and a polymer material such as polyvinylidene fluoride (PVDF), but embodiments of the present disclosure are not limited thereto. For example, when the piezoelectric material layer 321 includes MFC, MFC may have a ductile and flexible characteristic by fiberizing ceramic, and thus, vulnerability of fragile ceramic may be complemented and an output of generating electrical energy may be enhanced.

The second electrode layer 341 of the power generating device part 301b may be disposed on the piezoelectric material layer 321. The second electrode layer 341 may function as one of an anode or a cathode of the piezoelectric material layer 321. For example, the second electrode layer 341 may be a cathode. For example, the second electrode layer 341 may include one of silver (Ag), cupper (Cu), gold (Au), and aluminum (Al) or a combination thereof, but embodiments of the present disclosure are not limited thereto. The second electrode layer 341 may include the same material as that of the first electrode layer 331, or may include a different material. The second electrode layer 341 may be formed by coating (or forming) a paste of an electrode material on the piezoelectric material layer 321.

The magnetostriction material layer 350 of the power generating device part 301b may be disposed on the second electrode layer 341. The second adhesive layer 420 may be disposed between the magnetostriction material layer 350 and the second electrode layer 341 of the power generating device part 301*b*. The magnetostriction material layer 350 may be attached on and coupled or connected to the second electrode layer 341 by the second adhesive layer 420. The second adhesive layer 420 may include an adhesive or a double-sided tape, but embodiments of the present disclosure are not limited thereto. For example, the second adhesive layer 420 may include one of epoxy, acryl, silicone, and urethane, but embodiments of the present disclosure are not limited thereto. For example, the second adhesive layer 420 may further include an additive such as a hardener, a tackifier, a wax component, or an antioxidant or the like. For example, when the second adhesive layer 420 includes epoxy, the manufacturing cost may be reduced due to low price, a high temperature process may not be needed, atom diffusion and a chemical reaction may be minimized, and a deformation mismatch may be reduced by a thermal expansion mismatch between the magnetostriction material layer 350 and the second electrode layer 341. The second adhesive layer 420 may include the same material as that of the first adhesive layer 410, or may include a different material.

A first surface of the magnetostriction material layer 350 may be attached on and coupled or connected to the second electrode layer 341 by the second adhesive layer 420, and a second surface of the magnetostriction material layer 350 may be coupled or connected to one side 111 of the housing 110. The magnetostriction material layer 350 may be coupled or connected to the one side 111 of the housing 110 in a form where the one side 111 of the housing 110 closes an inner portion of the housing 110. Alternatively, the magnetostriction material layer 350 may be attached on and fixed to the one side 111 of the housing 110 having a cover shape which closes the inner portion of the housing 110. The magnetostriction material layer 350 may be disposed between the piezoelectric material layer 321 and the one side 111 of the housing 110, and thus, may act as a buffer member which complements vulnerability of fragile ceramic of the piezoelectric material layer 321.

The magnetostriction material layer 350 may include one of ferromagnetic metal, ferrite ceramic, a magnetostriction alloy, and a magnetic shape memory alloy. For example, the ferromagnetic metal may be iron (Fe), nickel (Ni), or cobalt (Co), but embodiments of the present disclosure are not limited thereto. The ferrite ceramic may be spinel or magnetoplumbite type ferrite represented by Formula $MFe_2O_4$ or $MFe_{12}O_{19}$ (where M is one or more divalent metal ions), ferrite represented by $M'_3Fe_5O_{12}$ (where M' is trivalent metal ions), or lithium ferrite represented by $Li_{0.5}Fe_{2.5}O_4$, but embodiments of the present disclosure are not limited thereto. The magnetostriction alloy may be terbium (Tb)-dysprosium (Dy)—Fe alloy (Terfenol), gallium (Ga)—Fe alloy (Gafenol), samarium (Sm)—Dy—Fe alloy (Samfenol), or B-silicone (Si)—Fe alloy (Metglas), but embodiments of the present disclosure are not limited thereto. The magnetic shape memory alloy may be $Ni_2MnGa$ alloy, NiMnIn alloy, NiCoMnIn alloy, FePd alloy, FeNiGa alloy, and CoNiGa alloy, but embodiments of the present disclosure are not limited thereto. However, in embodiments of the present disclosure, a material of the magnetostriction material layer 350 is not limited thereto.

Figure 2C:
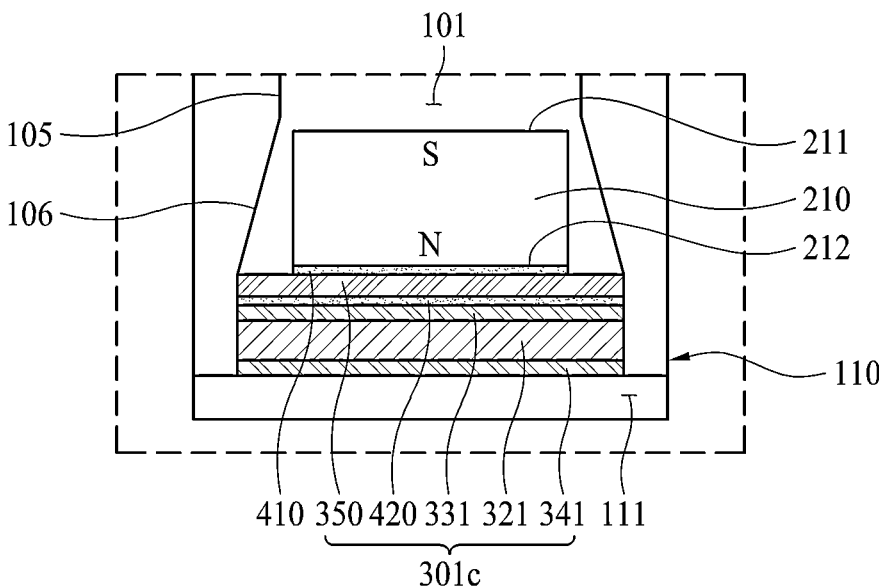
Figure 3C:
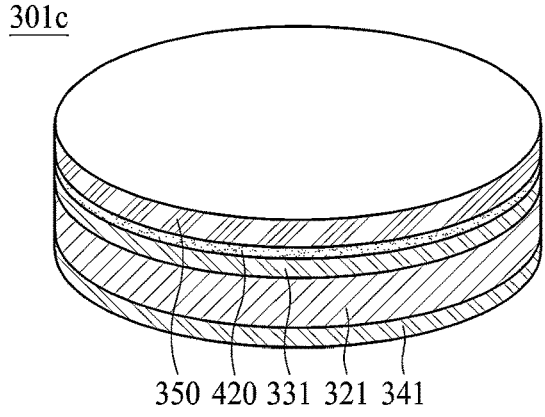

Referring to FIGS. 2C and 3C, an energy harvester 100 according to various embodiments of the present disclosure may include a power generating device part 301*c*. Except for that a configuration of the power generating device part 301*c* differs, the energy harvester 100 of FIG. 2C may be substantially the same as the energy harvester 100 of FIG. 2A or 2B, and thus, repeated descriptions are omitted.

The power generating device part 301*c* according to an embodiment of the present disclosure may have a structure where a piezoelectric member is coupled to a magnetostriction member. The power generating device part 301*c* may be stacked in a structure where the magnetostriction member is disposed between the piezoelectric member and a second magnet portion 210. The power generating device part 301*c* may include a magnetostriction material layer (or a magnetostriction member) 350, a second adhesive layer 420 disposed on the magnetostriction material layer 350, a first electrode layer 331 disposed on the second adhesive layer 420, a piezoelectric material layer 321 disposed on the first electrode layer 331, and a second electrode layer 341 disposed on the piezoelectric material layer 321.

In the power generating device part 301*c*, as illustrated in FIG. 3C, the magnetostriction material layer 350, the second adhesive layer 420, the first electrode layer 331, the piezoelectric material layer 321, and the second electrode layer 341 may be sequentially stacked. For example, the power generating device part 301*c* may have a circular plate shape. In the present disclosure, a shape of the power generating device part 301*c* is not limited thereto. For example, the power generating device part 301*c* may have various shapes such as a tetragonal shape or a ring shape.

The magnetostriction material layer 350 of the power generating device part 301*c* may be disposed on a second surface 212 of the second magnet portion 210. A first adhesive layer (or an adhesive member) 410 may be disposed between the magnetostriction material layer 350 of the power generating device part 301*c* and the second surface 212 of the second magnet portion 210. The magnetostriction material layer 350 may be attached on and coupled (or connected) to the second surface 212 of the second magnet portion 210 by the first adhesive layer 410. The first adhesive layer 410 may include an adhesive or a double-sided tape, but embodiments of the present disclosure are not limited thereto. For example, the first adhesive layer 410 may include one of epoxy, acryl, silicone, and urethane, but embodiments of the present disclosure are not limited thereto. For example, the first adhesive layer 410 may further include an additive such as a hardener, a tackifier, a wax component, or an antioxidant or the like. The magnetostriction material layer 350 may be disposed between the piezoelectric material layer 321 and the second magnet portion 210, and thus, may act as a buffer member which complements vulnerability of fragile ceramic of the piezoelectric material layer 321.

The first electrode layer 331 of the power generating device part 301*c* may be disposed on the magnetostriction material layer 350. The second adhesive layer 420 may be disposed between the magnetostriction material layer 350 and the first electrode layer 331 of the power generating device part 301*c*. The first electrode layer 331 may be attached on and coupled or connected to the magnetostriction material layer 350 by the second adhesive layer 420. The second adhesive layer 420 may include an adhesive or a double-sided tape, but embodiments of the present disclosure are not limited thereto. For example, the second adhesive layer 420 may include one of epoxy, acryl, silicone, and urethane, but embodiments of the present disclosure are not limited thereto. For example, the second adhesive layer 420 may further include an additive such as a hardener, a tackifier, a wax component, or an antioxidant or the like. For example, when the second adhesive layer 420 includes epoxy, the manufacturing cost may be reduced due to low price, a high temperature process may not be needed, atom diffusion and a chemical reaction may be minimized, and a deformation mismatch may be reduced by a thermal expansion mismatch between the magnetostriction material layer 350 and the first electrode layer 331. The second adhesive layer 420 may include the same material as that of the first adhesive layer 410, or may include a different material.

The first electrode layer 331 may function as one of an anode or a cathode of the piezoelectric material layer 321. For example, the first electrode layer 331 may be an anode. For example, the first electrode layer 331 may include one of silver (Ag), copper (Cu), gold (Au), and aluminum (Al) or a combination thereof, but embodiments of the present disclosure are not limited thereto. The first electrode layer 331 may be formed by coating a paste of an electrode material on the piezoelectric material layer 321.

The piezoelectric material layer 321 of the power generating device part 301c may be disposed on the first electrode layer 331. Also, the piezoelectric material layer 321 of the power generating device part 301c may be disposed on the second electrode layer 341. For example, the piezoelectric material layer 321 may be disposed between the first electrode layer 331 and the second electrode layer 341. The piezoelectric material layer 321 may include one of lead zirconate titanate (PZT), lead magnesium niobate-lead titanate (PMN—PT), lead zirconate niobate-lead titanate (PZN—PT), microfiber composites (MFC), $BaTiO_3$, a ceramic material such as a Na—K—Nb (NKN)-based material, and a polymer material such as polyvinylidene fluoride (PVDF), but embodiments of the present disclosure are not limited thereto. For example, when the piezoelectric material layer 321 includes MFC, MFC may have a ductile and flexible characteristic by fiberizing ceramic, and thus, vulnerability of fragile ceramic may be complemented and an output of generating electrical energy may be enhanced.

The second electrode layer 341 of the power generating device part 301c may be disposed on the piezoelectric material layer 321. The second electrode layer 341 of the power generating device part 301c may be coupled or connected to the one side 111 of the housing 110. The second electrode layer 341 may be coupled or connected and fixed to the one side 111 of the housing 110 in a form where the one side 111 of the housing 110 closes the inner portion of the housing 110. Alternatively, the second electrode layer 341 may be attached on and fixed to the one side 111 of the housing 110 having a cover shape which closes the inner portion of the housing 110.

The second electrode layer 341 may function as one of an anode or a cathode of the piezoelectric material layer 321. For example, the second electrode layer 341 may be a cathode. For example, the second electrode layer 341 may include one of silver (Ag), copper (Cu), gold (Au), and aluminum (Al) or a combination thereof, but embodiments of the present disclosure are not limited thereto. The second electrode layer 341 may include the same material as that of the first electrode layer 331, or may include a different material. The second electrode layer 341 may be formed by coating (or forming) a paste of an electrode material on the piezoelectric material layer 321.

Figure 2D:
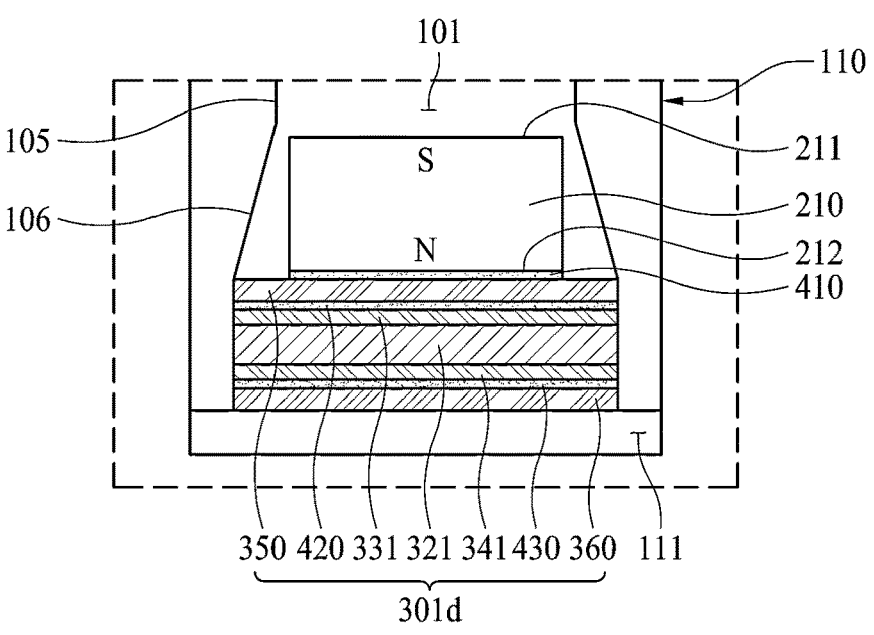
Figure 3D:
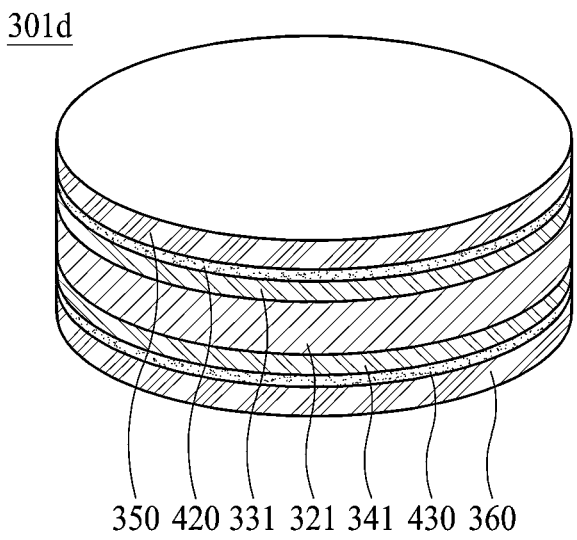

Referring to FIGS. 2D and 3D, an energy harvester 100 according to various embodiments of the present disclosure may include a power generating device part 301d. Except for that a configuration of the power generating device part 301d differs, the energy harvester 100 of FIG. 2D may be substantially the same as the energy harvester 100 of FIGS. 2A to 2C, and thus, repeated descriptions are omitted.

The power generating device part 301d according to an embodiment of the present disclosure may have a structure where a piezoelectric member is coupled to at least one magnetostriction member. The power generating device part 301d may be stacked in a structure where the at least one magnetostriction member is disposed at each of both sides with the piezoelectric member therebetween. The power generating device part 301d may include a first magnetostriction material layer (or at least one magnetostriction member) 350, a second adhesive layer 420 disposed on the first magnetostriction material layer 350, a first electrode layer 331 disposed on the second adhesive layer 420, a piezoelectric material layer 321 disposed on the first electrode layer 331, a second electrode layer 341 disposed on the piezoelectric material layer 321, a third adhesive layer 430 disposed on the second electrode layer 341, and a second magnetostriction material layer (or at least one magnetostriction member) 360 disposed on the third adhesive layer 430.

In the power generating device part 301d, as illustrated in FIG. 3D, the first magnetostriction material layer 350, the second adhesive layer 420, the first electrode layer 331, the piezoelectric material layer 321, the second electrode layer 341, the third adhesive layer 430, and the second magnetostriction material layer 360 may be sequentially stacked. For example, the power generating device part 301d may have a circular plate shape. In embodiments of the present disclosure, a shape of the power generating device part 301d is not limited thereto. For example, the power generating device part 301d may have various shapes such as a tetragonal shape or a ring shape or the like. The first magnetostriction material layer 350 of the power generating device part 301d may be disposed on a second surface 212 of the second magnet portion 210. A first adhesive layer (or an adhesive member) 410 may be disposed between the first magnetostriction material layer 350 of the power generating device part 301d and the second surface 212 of the second magnet portion 210. The first magnetostriction material layer 350 may be attached on and coupled (or connected) to the second surface 212 of the second magnet portion 210 by the first adhesive layer 410. The first adhesive layer 410 may include an adhesive or a double-sided tape, but embodiments of the present disclosure are not limited thereto. For example, the first adhesive layer 410 may include one of epoxy, acryl, silicone, and urethane, but embodiments of the present disclosure are not limited thereto. For example, the first adhesive layer 410 may further include an additive such as a hardener, a tackifier, a wax component, or an antioxidant or the like.

The first electrode layer 331 of the power generating device part 301d may be disposed on the first magnetostriction material layer 350. The second adhesive layer 420 may be disposed between the first magnetostriction material layer 350 and the first electrode layer 331 of the power generating device part 301d. The first electrode layer 331 may be attached on and coupled or connected to the first magnetostriction material layer 350 by the second adhesive layer 420. The second adhesive layer 420 may include an adhesive or a double-sided tape, but embodiments of the present disclosure are not limited thereto. For example, the second adhesive layer 420 may include one of epoxy, acryl, silicone, and urethane, but embodiments of the present disclosure are not limited thereto. For example, the second adhesive layer 420 may further include an additive such as a hardener, a tackifier, a wax component, or an antioxidant or the like. For example, when the second adhesive layer 420 includes epoxy, the manufacturing cost may be reduced due to low price, a high temperature process may not be needed, atom diffusion and a chemical reaction may be minimized, and a deformation mismatch may be reduced by a thermal expansion mismatch between the first magnetostriction material layer 350 and the first electrode layer 331. The second adhesive layer 420 may include the same material as that of the first adhesive layer 410, or may include a different material.

The first electrode layer 331 may function as one of an anode or a cathode of the piezoelectric material layer 321. For example, the first electrode layer 331 may be an anode. For example, the first electrode layer 331 may include one of silver (Ag), copper (Cu), gold (Au), and aluminum (Al) or a combination thereof, but embodiments of the present disclosure are not limited thereto. The first electrode layer 331 may be formed by coating (or forming) a paste of an electrode material on the piezoelectric material layer 321.

The piezoelectric material layer 321 of the power generating device part 301*d* may be disposed on the first electrode layer 331. Also, the piezoelectric material layer 321 of the power generating device part 301*d* may be disposed on the second electrode layer 341. For example, the piezoelectric material layer 321 may be disposed between the first electrode layer 331 and the second electrode layer 341. The piezoelectric material layer 321 may include one of lead zirconate titanate (PZT), lead magnesium niobate-lead titanate (PMN—PT), lead zirconate niobate-lead titanate (PZN—PT), microfiber composites (MFC), BaTiO₃, a ceramic material such as a Na—K—Nb (NKN)-based material, and a polymer material such as polyvinylidene fluoride (PVDF), but embodiments of the present disclosure are not limited thereto. For example, when the piezoelectric material layer 321 includes MFC, MFC may have a ductile and flexible characteristic by fiberizing ceramic, and thus, vulnerability of fragile ceramic may be complemented and an output of generating electrical energy may be enhanced.

The second electrode layer 341 of the power generating device part 301*d* may be disposed on the piezoelectric material layer 321. The second electrode layer 341 may function as one of an anode or a cathode of the piezoelectric material layer 321. For example, the second electrode layer 341 may be a cathode. For example, the second electrode layer 341 may include one of silver (Ag), copper (Cu), gold (Au), and aluminum (Al) or a combination thereof, but embodiments of the present disclosure are not limited thereto. The second electrode layer 341 may include the same material as that of the first electrode layer 331, or may include a different material. The second electrode layer 341 may be formed by coating a paste of an electrode material on the piezoelectric material layer 321.

The second magnetostriction material layer 360 of the power generating device part 301*d* may be disposed on the second electrode layer 341. The third adhesive layer 430 may be disposed between the second magnetostriction material layer 360 and the second electrode layer 341 of the power generating device part 301*d*. The second magnetostriction material layer 360 may be attached on and coupled or connected to the second electrode layer 341 by the third adhesive layer 430. The third adhesive layer 430 may include an adhesive or a double-sided tape. For example, the third adhesive layer 430 may include the same material as that of each of the first adhesive layer 410 and the second adhesive layer 420, or may include a different material, or may include the same material as that of the second adhesive layer 420 and may include a material which differs from that of the first adhesive layer 410. Also, the second electrode layer 341 may include the same material as that of the first electrode layer 331, or may include a different material.

A first surface of the second magnetostriction material layer 360 may be attached on and coupled or connected to the second electrode layer 341 by the third adhesive layer 430, and a second surface of the second magnetostriction material layer 360 may be coupled or connected to one side 111 of the housing 110. The second magnetostriction material layer 360 may be coupled or connected to the one side 111 of the housing 110 in a form where the one side 111 of the housing 110 closes an inner portion of the housing 110. According to another embodiment of the present disclosure, the second magnetostriction material layer 360 may be attached on and fixed to the one side 111 of the housing 110 having a cover shape which closes the inner portion of the housing 110. The second magnetostriction material layer 360 may include the same material as that of the first magnetostriction material layer 350, or may include a different material. The first and second magnetostriction material layers 350 and 360 may be respectively disposed at both sides with the piezoelectric material layer 321 therebetween and may act as a buffer member which complements vulnerability of fragile ceramic of the piezoelectric material layer 321.

Figure 2E:
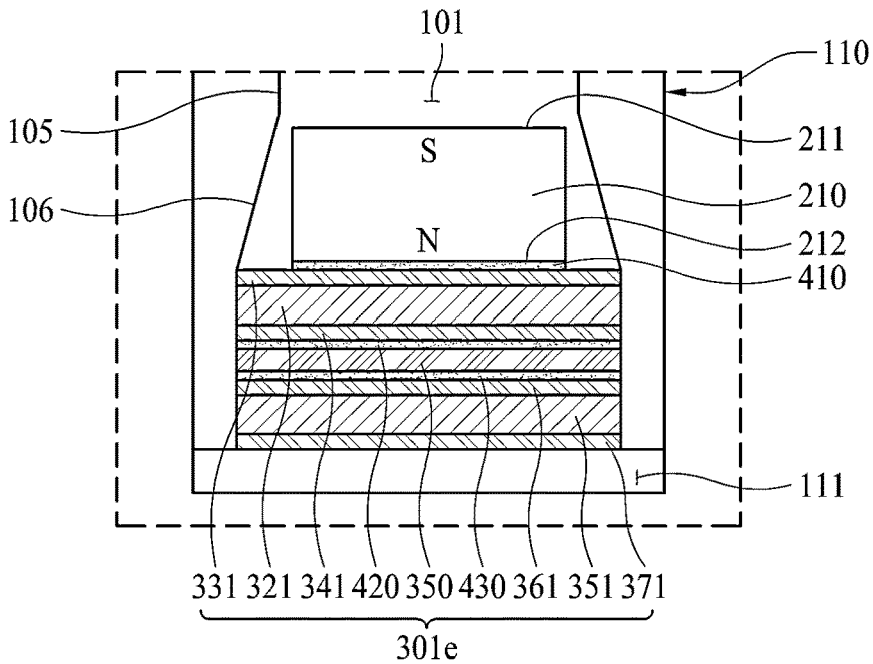
Figure 3E:
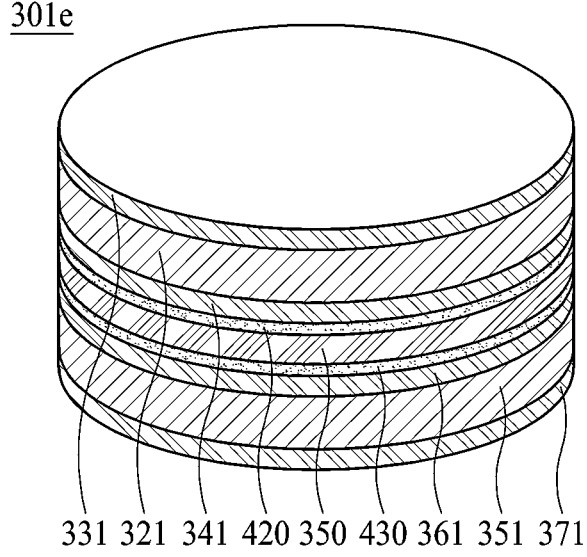

Referring to FIGS. 2E and 3E, an energy harvester 100 according to various embodiments of the present disclosure may include a power generating device part 301*e*. Except for that a configuration of the power generating device part 301*e* differs, the energy harvester 100 of FIG. 2E may be substantially the same as the energy harvester 100 of FIGS. 2A to 2D, and thus, repeated descriptions are omitted.

The power generating device part 301*e* according to an embodiment of the present disclosure may have a structure where at least one piezoelectric member is coupled to a magnetostriction member. The power generating device part 301*e* may be stacked in a structure where the magnetostriction member is disposed between at least one first piezoelectric member and at least one second piezoelectric member. The power generating device part 301*e* may include a first electrode layer 331, a first piezoelectric material layer 321 disposed on the first electrode layer 331, a second electrode layer 341 disposed on the first piezoelectric material layer 321, a second adhesive layer 420 disposed on the second electrode layer 341, a magnetostriction material layer (or a magnetostriction member) 350 disposed on the second adhesive layer 420, a third adhesive layer 430 disposed on the magnetostriction material layer 350, a third electrode layer 361 disposed on the third adhesive layer 430, a second piezoelectric material layer 351 disposed on the third electrode layer 361, and a fourth electrode layer 371 disposed on the second piezoelectric material layer 351.

In the power generating device part 301*e*, as illustrated in FIG. 3E, the first electrode layer 331, the first piezoelectric material layer 321, the second electrode layer 341, the second adhesive layer 420, the magnetostriction material layer 350, the third adhesive layer 430, the third electrode layer 361, the second piezoelectric material layer 351, and the fourth electrode layer 371 may be sequentially stacked. For example, the power generating device part 301*e* may have a circular plate shape. However, in the present disclosure, a shape of the power generating device part 301*d* is not limited thereto, and the power generating device part 301*e* may have various shapes such as a tetragonal shape or a ring shape or the like.

The first electrode layer 331 of the power generating device part 301*e* may be disposed on a second surface 212 of a second magnet portion 210. A first adhesive layer (or an adhesive member) 410 may be disposed between the first electrode layer 331 of the power generating device part 301e and the second surface 212 of the second magnet portion 210. The first electrode layer 331 may be attached on and coupled or connected to the second surface 212 of the second magnet portion 210 by a first adhesive layer 410. The first adhesive layer 410 may include an adhesive or a double-sided tape, but embodiments of the present disclosure are not limited thereto. For example, the first adhesive layer 410 may include one of epoxy, acryl, silicone, and urethane, but embodiments of the present disclosure are not limited thereto. For example, the first adhesive layer 410 may further include an additive such as a hardener, a tackifier, a wax component, or an antioxidant or the like.

The first electrode layer 331 may function as one of an anode or a cathode of the first piezoelectric material layer 321. For example, the first electrode layer 331 may be a cathode. For example, the first electrode layer 331 may include one of silver (Ag), copper (Cu), gold (Au), and aluminum (Al) or a combination thereof, but embodiments of the present disclosure are not limited thereto. The first electrode layer 331 may be formed by coating a paste of an electrode material on the first piezoelectric material layer 321.

The first piezoelectric material layer 321 of the power generating device part 301e may be disposed on the first electrode layer 331. Also, the first piezoelectric material layer 321 of the power generating device part 301e may be disposed on the second electrode layer 341. For example, first piezoelectric material layer 321 may be disposed between the first electrode layer 331 and the second electrode layer 341. The first piezoelectric material layer 321 may include one of lead zirconate titanate (PZT), lead magnesium niobate-lead titanate (PMN—PT), lead zirconate niobate-lead titanate (PZN—PT), microfiber composites (MFC), BaTiO$_3$, a ceramic material such as a Na—K—Nb (NKN)-based material, and a polymer material such as polyvinylidene fluoride (PVDF), but embodiments of the present disclosure are not limited thereto. For example, when the first piezoelectric material layer 321 includes MFC, MFC may have a ductile and flexible characteristic by fiberizing ceramic, and thus, vulnerability of fragile ceramic may be complemented and an output of generating electrical energy may be enhanced.

The second electrode layer 341 of the power generating device part 301e may be disposed on the first piezoelectric material layer 321. The second electrode layer 341 may function as one of an anode or a cathode of the first piezoelectric material layer 321. For example, the second electrode layer 341 may be a cathode. For example, the second electrode layer 341 may include one of silver (Ag), copper (Cu), gold (Au), and aluminum (Al) or a combination thereof, but embodiments of the present disclosure are not limited thereto. The second electrode layer 341 may include the same material as that of the first electrode layer 331, or may include a different material. The second electrode layer 341 may be formed by coating (or forming) a paste of an electrode material on the piezoelectric material layer 321.

The magnetostriction material layer 350 of the power generating device part 301e may be disposed on the second electrode layer 341. The second adhesive layer 420 may be disposed between the magnetostriction material layer 350 and the second electrode layer 341 of the power generating device part 301e. The magnetostriction material layer 350 may be attached on and coupled or connected to the second electrode layer 341 by the second adhesive layer 420. The second adhesive layer 420 may include an adhesive or a double-sided tape, but embodiments of the present disclosure are not limited thereto. For example, the second adhesive layer 420 may include one of epoxy, acryl, silicone, and urethane, but embodiments of the present disclosure are not limited thereto. For example, the second adhesive layer 420 may further include an additive such as a hardener, a tackifier, a wax component, or an antioxidant or the like. For example, when the second adhesive layer 420 includes epoxy, the manufacturing cost may be reduced due to low price, a high temperature process may not be needed, atom diffusion and a chemical reaction may be minimized, and a deformation mismatch may be reduced by a thermal expansion mismatch between the magnetostriction material layer 350 and the second electrode layer 341. The second adhesive layer 420 may include the same material as that of the first adhesive layer 410, or may include a different material.

The third electrode layer 361 of the power generating device part 301e may be disposed on the magnetostriction material layer 350. The third adhesive layer 430 may be disposed between the magnetostriction material layer 350 and the third electrode layer 361 of the power generating device part 301e. The third adhesive layer 430 may include an adhesive or a double-sided tape. For example, the third electrode layer 430 may include the same material as that of each of the first adhesive layer 410 and the second adhesive layer 420, or may include a different material, or may include the same material as that of the second adhesive layer 420 and may include a material which differs from that of the first adhesive layer 410.

A first surface of the magnetostriction material layer 350 may be attached on and coupled (or connected) to the second electrode layer 341 by the second adhesive layer 420, and a second surface of the magnetostriction material layer 350 may be attached on and coupled (or connected) to the third electrode layer 461 by the third adhesive layer 430. For example, the magnetostriction material layer 350 may be disposed between the second electrode layer 341 and the third electrode layer 361.

The magnetostriction material layer 350 may include one of ferromagnetic metal, ferrite ceramic, a magnetostriction alloy, and a magnetic shape memory alloy. For example, the ferromagnetic metal may be iron (Fe), nickel (Ni), or cobalt (Co), but embodiments of the present disclosure are not limited thereto. The ferrite ceramic may be spinel or magnetoplumbite type ferrite represented by Formula MFe$_2$O$_4$ or MFe$_{12}$O$_{19}$ (where M is one or more divalent metal ions), ferrite represented by M'$_3$Fe$_5$O$_{12}$ (where M' is trivalent metal ions), or lithium ferrite represented by Li$_{0.5}$Fe$_{2.5}$O$_4$, but embodiments of the present disclosure are not limited thereto. The magnetostriction alloy may be terbium (Tb)—dysprosium (Dy)—Fe alloy (Terfenol), gallium (Ga)—Fe alloy (Gafenol), samarium (Sm)—Dy—Fe alloy (Samfenol), or B-silicone (Si)—Fe alloy (Metglas), but embodiments of the present disclosure are not limited thereto. The magnetic shape memory alloy may be Ni$_2$MnGa alloy, NiMnIn alloy, NiCoMnIn alloy, FePd alloy, FeNiGa alloy, and CoNiGa alloy, but embodiments of the present disclosure are not limited thereto. However, in the present disclosure, a material of the magnetostriction material layer 350 is not limited thereto.

The third electrode layer 361 may function as one of an anode or a cathode of the second piezoelectric material layer 351. For example, the third electrode layer 361 may be an anode. For example, the third electrode layer 361 may include one of silver (Ag), copper (Cu), gold (Au), and aluminum (Al) or a combination thereof, but embodiments of the present disclosure are not limited thereto. The third electrode layer 361 may be formed by coating (or forming) a paste of an electrode material on the second piezoelectric material layer 351.

The second piezoelectric material layer 351 of the power generating device part 301e may be disposed on the third electrode layer 361. Also, the second piezoelectric material layer 351 of the power generating device part 301e may be disposed on the fourth electrode layer 371. For example, the second piezoelectric material layer 351 may be disposed between the third electrode layer 361 and the fourth electrode layer 371. The second piezoelectric material layer 351 may include the same material as that of the first piezoelectric material layer 321, or may include a different material.

The fourth electrode layer 371 of the power generating device part 301e may be disposed on the second piezoelectric material layer 351. The fourth electrode layer 371 of the power generating device part 301e may be coupled or connected to the one side 111 of the housing 110. The second electrode layer 341 may be coupled or connected and fixed to one side 111 of the housing 110 in a form where the one side 111 of the housing 110 closes an inner portion of the housing 110. Alternatively, the fourth electrode layer 371 may be attached on and fixed to the one side 111 of the housing 110 having a cover shape which closes the inner portion of the housing 110.

The fourth electrode layer 371 may function as one of an anode or a cathode of the second piezoelectric material layer 371. For example, the fourth electrode layer 371 may be a cathode. For example, the fourth electrode layer 371 may include one of Ag, Cu, Au, and Al or a combination thereof, but embodiments of the present disclosure are not limited thereto. The fourth electrode layer 371 may be formed by coating a paste of an electrode material on the second piezoelectric material layer 351. The fourth electrode layer 371 may include the same material as that of the third electrode layer 361, or may include a different material.

Figure 4A:
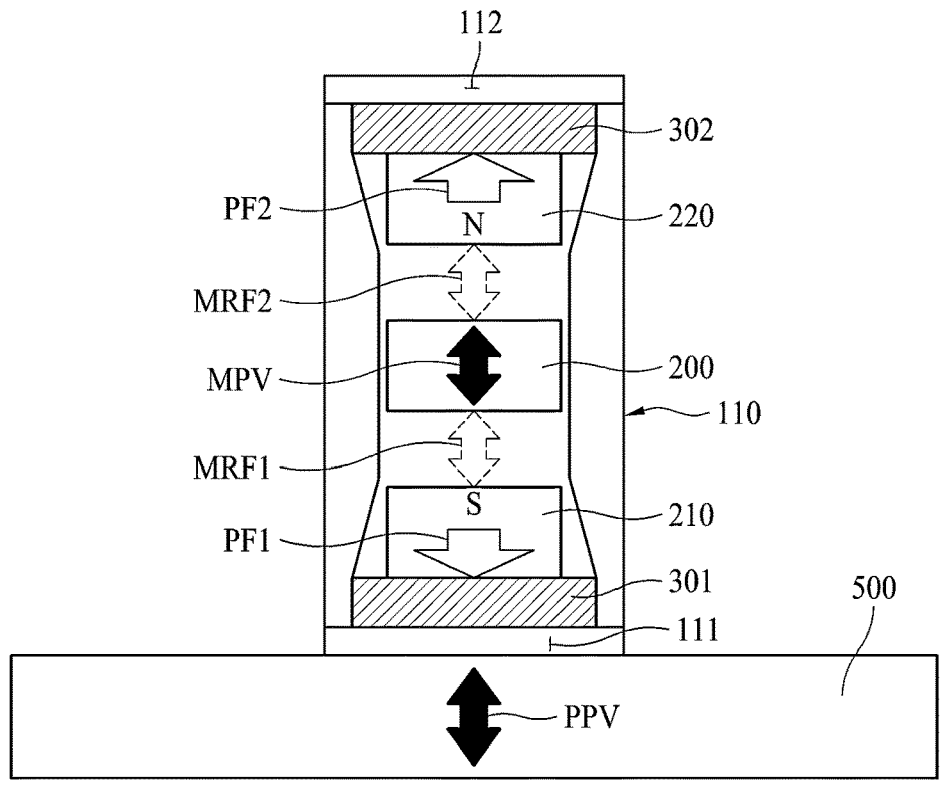
FIGS. 4A and 4B illustrate an operation of an energy harvester according to various embodiments of the present disclosure.
Figure 4B:
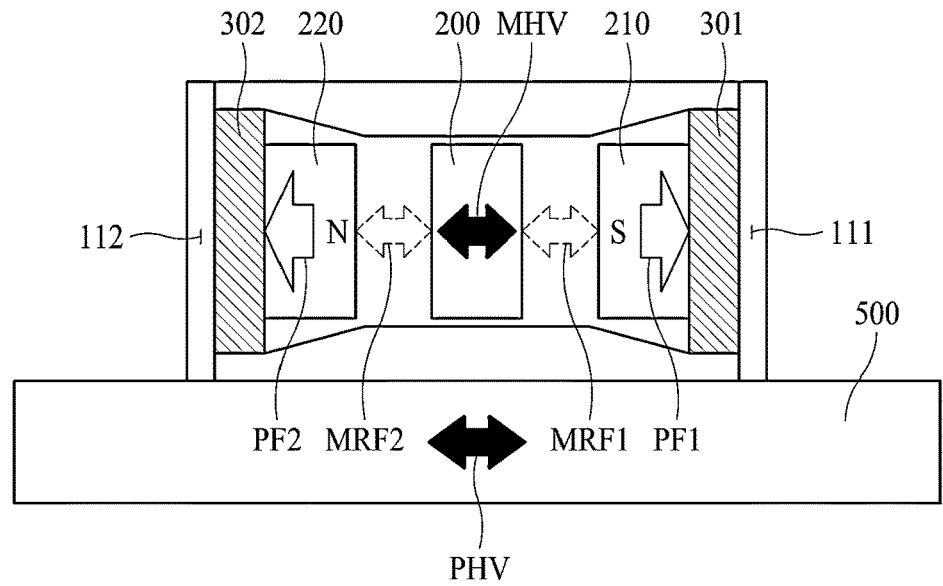

FIGS. 4A and 4B are diagrams for describing an operation of an energy harvester 100 according to various embodiments of the present disclosure.

To provide a description with reference to FIGS. 4A and 4B, the energy harvester 100 according to various embodiments of the present disclosure may be coupled or connected to a vibration panel 500 which vibrates in a vertical or horizontal direction and may generate electrical energy by an external vibration of the vibration panel 500. The energy harvester 100 may be coupled or connected to the vibration panel 500 to correspond to a vibration direction of the vibration panel 500.

Referring to FIG. 4A, an energy harvester 100 according to various embodiments of the present disclosure may be coupled or connected to a vibration panel 500 which vibrates in a vertical direction PPV. The energy harvester 100 may include a housing 110 including an inner space which is holed in a lengthwise direction, a first magnet portion 200 provided at a center portion of the inner space, a 2-$1^{st}$ magnet portion 210 disposed at one side of the first magnet portion 200, a first power generating device part 301 disposed at one side 111 of the housing 110 to contact the 2-$1^{st}$ magnet portion 210, a 2-$2^{nd}$ magnet portion 220 disposed at the other side of the first magnet portion 200, and a second power generating device part 302 disposed at the other side 112 of the housing 110 to contact the 2-$2^{nd}$ magnet portion 220. The first power generating device part 301, the 2-$1^{st}$ magnet portion 210, the first magnet portion 200, the 2-$2^{nd}$ magnet portion 220, and the second power generating device part 302 may be arranged in a lengthwise direction (or a vertical direction) of the housing 110.

The housing 110 of the energy harvester 100 may be coupled or connected to the vibration panel 500 to correspond to a perpendicular vibration PPV of the vibration panel 500. For example, the housing 110 of the energy harvester 100 may be vertically coupled or connected to a plane of the vibration panel 500. In the energy harvester 100, an adhesive member may be disposed at the one side 111 of the housing 110, and the one side 111 of the housing 110 may be attached on and coupled or connected to the vibration panel 500 by the adhesive member. Alternatively, in the energy harvester 100, an adhesive member may be disposed at the other side 112 of the housing 110, and the other side 112 of the housing 110 may be attached on and coupled or connected to the vibration panel 500 by the adhesive member.

In the energy harvester 100, when the perpendicular vibration PPV is generated in the vibration panel 500, the first magnet portion 200 disposed at a center of an inner space of the housing 110 may vibrate in the vertical direction based on an external perpendicular vibration MPV. A perpendicular vibration MVP of the first magnet portion 200 may be transferred to each of the 2-$1^{st}$ magnet portion 210 and the 2-$2^{nd}$ magnet portion 220 based on a magnetic repulsive force MRF1 with the 2-$1^{st}$ magnet portion 210 and a magnetic repulsive force MRF2 with the 2-$2^{nd}$ magnet portion 220. The 2-$1^{st}$ magnet portion 210 may apply a force PF1 based on a vibration, transferred through the magnetic repulsive force MRF1, to the first power generating device part 301, and the 2-$2^{nd}$ magnet portion 220 may apply a force PF2 based on a vibration, transferred through the magnetic repulsive force MRF2, to the second power generating device part 302. Accordingly, the first power generating device part 301 and the second power generating device part 302 may be deformed by the forces PF1 and PF2 respectively applied from the 2-$1^{st}$ magnet portion 210 and the 2-$2^{nd}$ magnet portion 220 to generate electrical energy.

Referring to FIG. 4B, an energy harvester 100 according to various embodiments of the present disclosure may be coupled or connected to a vibration panel 500 which vibrates in a horizontal direction PHV.

The housing 110 of the energy harvester 100 may be coupled or connected to the vibration panel 500 to correspond to a horizontal vibration PHV of the vibration panel 500. For example, the housing 110 of the energy harvester 100 may be vertically coupled or connected to a plane of the vibration panel 500. In the energy harvester 100, an adhesive member may be disposed at a lateral surface of the housing 110, and the lateral surface of the housing 110 may be attached on and coupled or connected to the vibration panel 500 by g the adhesive member.

In the energy harvester 100, when the horizontal vibration MHV is generated in the vibration panel 500, the first magnet portion 200 disposed at a center of an inner space of the housing 110 may vibrate in the horizontal direction MHV based on an external horizontal vibration PHV. A horizontal vibration MHP of the first magnet portion 200 may be transferred to each of the 2-$1^{st}$ magnet portion 210 and the 2-$2^{nd}$ magnet portion 220 based on a magnetic repulsive force MRF1 with the 2-$1^{st}$ magnet portion 210 and a magnetic repulsive force MRF2 with the 2-$2^{nd}$ magnet portion 220. The 2-$1^{st}$ magnet portion 210 may apply a force PF1 based on a vibration, transferred through the magnetic repulsive force MRF1, to the first power generating device part 301, and the 2-$2^{nd}$ magnet portion 220 may apply a force PF2 based on a vibration, transferred through the magnetic repulsive force MRF2, to the second power generating device part 302. Accordingly, the first power generating device part 301 and the second power generating device part 302 may be deformed by the forces PF1 and PF2 respectively applied from the 2-1$^{st}$ magnet portion 210 and the 2-2$^{nd}$ magnet portion 220 to generate electrical energy.

Figure 5:
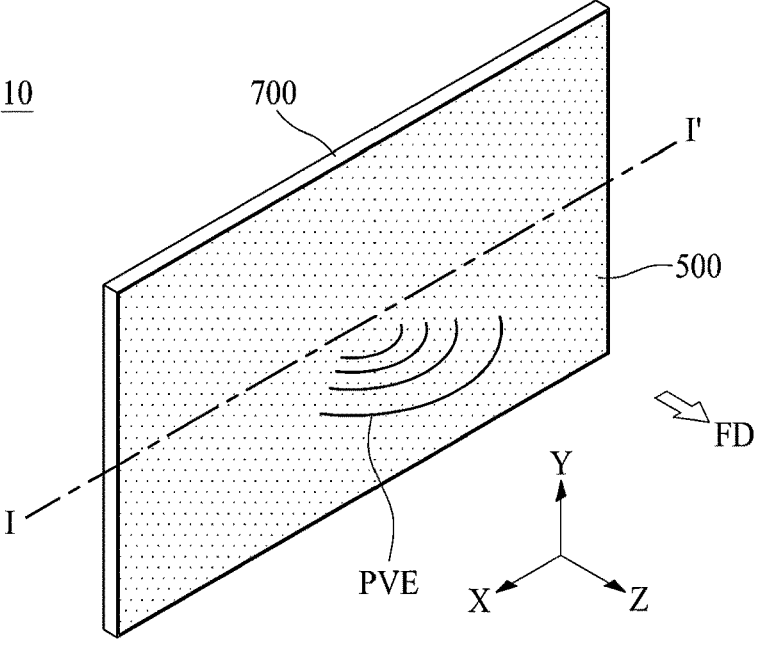
FIG. 5 illustrate a display apparatus according to various embodiments of the present disclosure.

FIG. 5 illustrates a display apparatus according to various embodiments of the present disclosure. FIGS. 6A to 6E are cross-sectional views taken along line I-I' of FIG. 5 and illustrate an energy harvester and a vibration generating apparatus according to various embodiments of the present disclosure.

Figure 6A:
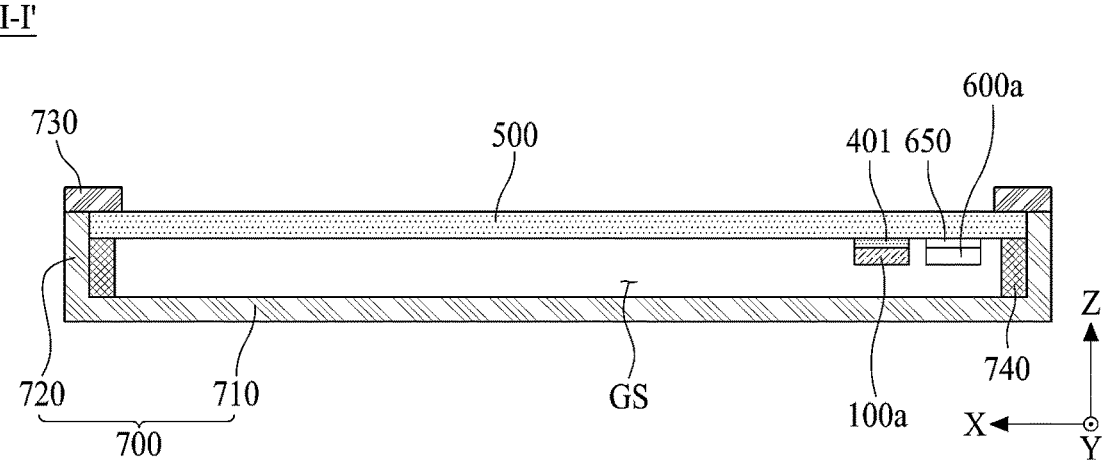
FIGS. 6A to 6E are cross-sectional views taken along line I-I' of FIG. 5 and illustrate an energy harvester and a vibration generating apparatus according to various embodiments of the present disclosure.
Figure 6B:
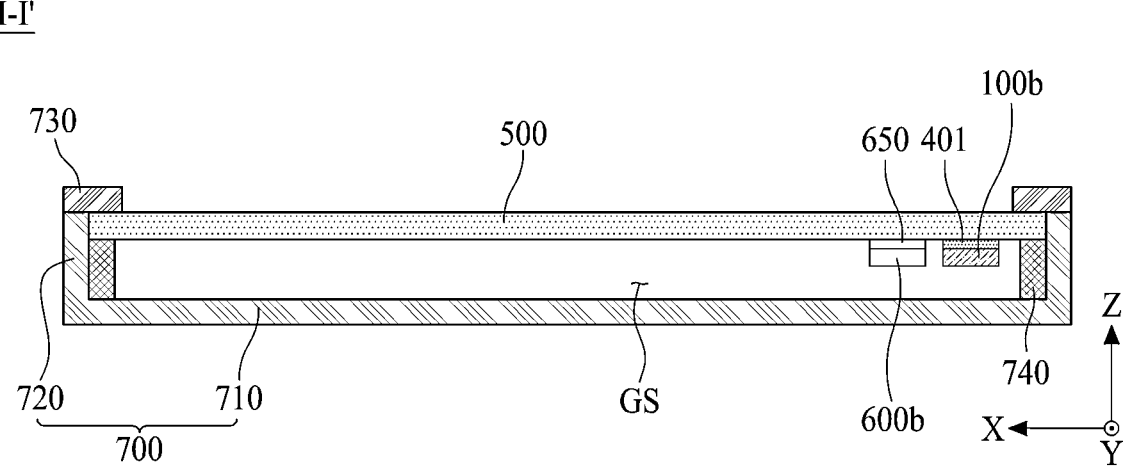
Figure 6C:
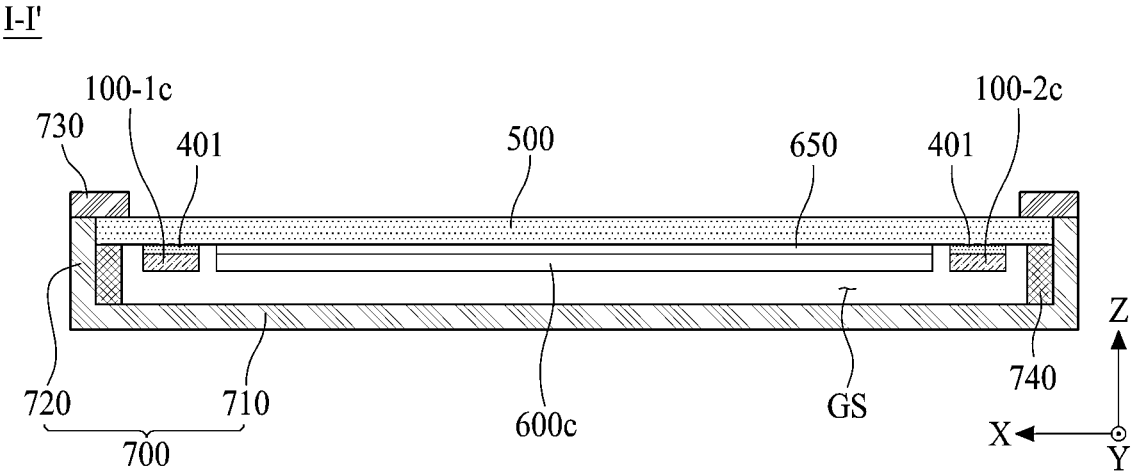
Figure 6D:
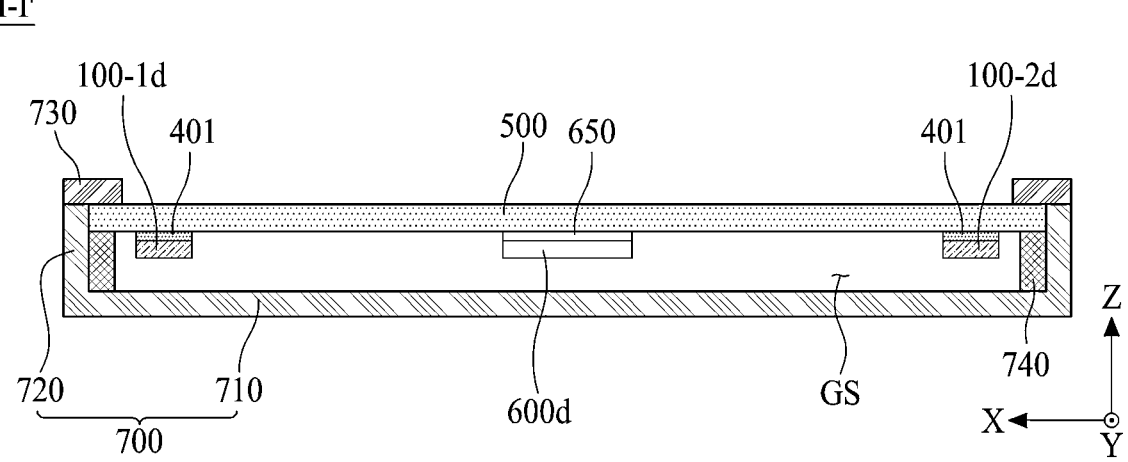
Figure 6E:
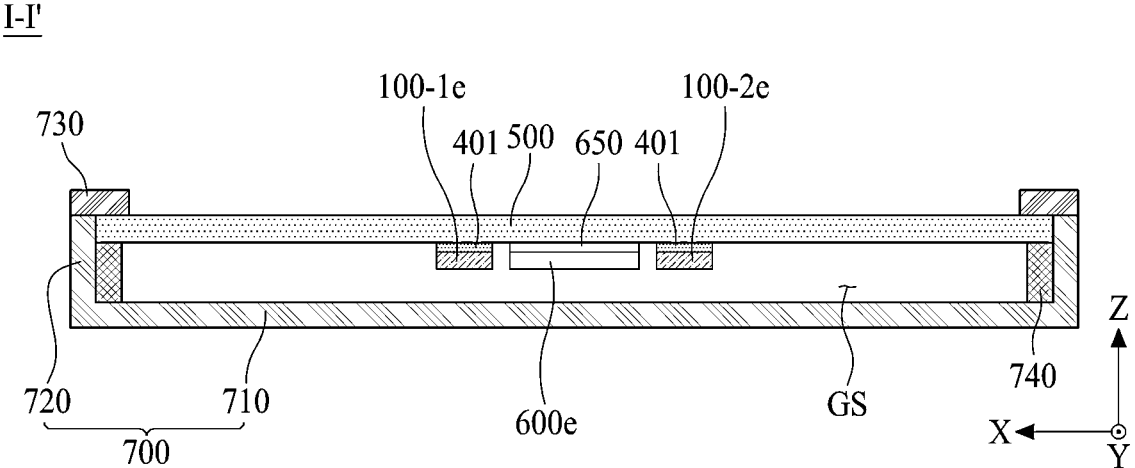

With reference to FIGS. 5 to 6E, the display apparatus 10 according to various embodiments of the present disclosure may include a display panel (or a vibration panel) 500, a cover member 700, a vibration generating apparatus 600 disposed on a rear surface (or a backside surface) of the display panel 500, and an energy harvester 100 disposed on the rear surface of the display panel 500.

The display panel 500 may display an image (for example, an electronic image or a digital image). For example, the display panel 500 may emit light to display an image.

According to an embodiment of the present disclosure, the display panel 500 may be a curved display panel or any type of display panels such as a liquid crystal display panel, an organic light emitting display panel, a quantum dot light emitting display panel, a micro light emitting diode display panel, an electrophoretic display panel, or an electro-wetting display panel, but embodiments of the present disclosure are not limited thereto. The display panel 500 may vibrate based on a vibration of the vibration generating apparatus 600 to output a vibration in a forward direction FD thereof. For example, the display panel 500 may vibrate based on a vibration of the vibration generating apparatus 600 to directly output vibration energy PVE in the forward direction FD. For example, the display panel 500 may directly output a sound based on the vibration energy PVE in the forward direction FD, and thus, the display panel 500 may be a speaker or a vibration plate (or a vibration panel) which directly generates a sound. Alternatively, the display panel 500 may output a haptic feedback signal (or a tactile feedback signal) based on the vibration energy PVE. Also, the display panel 500 may vibrate based on a vibration of the vibration generating apparatus 600 to transfer the vibration energy PVE to the energy harvester 100. For example, the display panel 500 may directly act on the vibration energy PVE, and thus, the display panel 500 may be a vibration panel which directly transfers a vibration to the energy harvester 100.

The display panel 500 according to an embodiment of the present disclosure may include a display area which displays an image based on driving of a plurality of pixels arranged on a substrate and a non-display area which surrounds the display area. For example, in the display panel 500, a whole front surface of the substrate may be implemented as the display area without the non-display area, based on a non-bezel structure. For example, the display panel 500 may be a transparent display panel including a light transmission portion disposed at at least one of the plurality of pixels.

The display panel 500 according to an embodiment of the present disclosure may display an image as a type such as a top emission type, a bottom emission type, or a dual emission type based on a structure of a pixel array layer including an anode electrode, a cathode electrode, and a light emitting device layer. The top emission type may irradiate visible light, generated from the pixel array layer, in a forward direction of a base substrate to display an image, and the bottom emission type may irradiate the visible light, generated from the pixel array layer, in a rearward direction of the base substrate to display an image. For example, the light emitting device layer may include an organic light emitting layer or a micro light emitting diode which is electrically connected to each of an anode electrode or a cathode electrode thereof. The micro light emitting diode may be a light emitting diode implemented as an integrated circuit (IC) or a chip type and may include a first terminal electrically connected to the anode electrode and a second terminal electrically connected to the cathode electrode. The cathode electrode may be connected to the light emitting device of the light emitting device layer provided in each pixel area in common.

The display apparatus 10 according to various embodiments of the present disclosure may include a cover member 700 which covers the display panel 500.

The cover member 700 may be referred to as other terms such as a cover bottom, a plate bottom, a back cover, a base frame, a metal frame, a metal chassis, a chassis base, or an m-chassis, but the terms are not limited thereto. Accordingly, the cover member 700 may be implemented as any type of frame or a plate structure, which is disposed on a rear surface of the display panel 500. The cover member 700 may include a rear structure.

The cover member 700 may cover the rear surface of the display panel 500. For example, the cover member 700 may cover the whole rear surface of the display panel 500 with a gap space GS therebetween. The cover member 700 according to an embodiment may include at least one of a glass material, a metal material, and a plastic material. For example, the cover member 700 including the glass material may be sapphire glass. For example, the cover member 700 including the metal material may include one material of aluminum (Al), an Al alloy, magnesium (Mg), an Mg alloy, and a Fe—Ni alloy, but embodiments of the present disclosure are not limited thereto.

The cover member 700 according to an embodiment of the present disclosure may additionally cover a lateral surface of the display panel 500. For example, the cover member 700 may include a rear portion 710 which covers the rear surface of the display panel 500 with the gap space GS therebetween and a lateral portion 720 which is connected to an end of the rear portion 710 and covers the lateral surface of the display panel 500. However, embodiments of the present disclosure are not limited thereto, and the cover member 700 may be a single-body structure where the rear portion 710 and the lateral portion 720 are implemented as one body.

The lateral portion 720 may be implemented as a separate middle frame coupled or connected to the cover member 700. In this case, the lateral portion 720 implemented as the middle frame may cover the cover member 700 (for example, all of a lateral surface of the rear portion 710 and the lateral surface of the display panel 500). For example, the lateral portion 720 implemented as the middle frame may include a material, which is the same as or different from that of the cover member 700, of a metal material and a plastic material.

The cover member 700 according to an embodiment of the present disclosure may be disposed at a rear edge (or a rear periphery) of the display panel 500 by a panel connection member (or a connection member) 740. For example, the panel connection member 740 may be disposed between the rear edge of the display panel 500 and a front edge (or a front periphery) of the cover member 700 and may attach the display panel 500 on the cover member 700. The panel connection member 740 according to an embodiment may be implemented as a double-sided tape, a single-sided tape, or a double-sided adhesive foam pad, but embodiments of the present disclosure are not limited thereto.

The cover member 700 according to an embodiment of the present disclosure may further include a front portion 730 which covers the front edge of the display panel 500. The front portion 730 may have a picture frame form including an opening portion overlapping the display area of the display panel 500. For example, the front portion 730 may be coupled (or connected) to the rear portion 710 or the middle frame and may cover the front edge of the display panel 500, and thus, may support or fix the display panel 500. The front portion 730 may be disposed at the front edge of the display panel 500 and may be directly exposed to a user (or a viewer), and thus, a sense of beauty of an external appearance in design of the display apparatus 10 may be reduced and a bezel width of the display apparatus 10 may increase. In order to solve such a problem, the display panel 500 may be connected to the cover member 700 through the panel connection member 740, and thus, the front portion 730 may be omitted (or removed), whereby a bezel width of the display apparatus 10 may be reduced or removed to enhance a sense of beauty of an external appearance in design of the display apparatus 10.

The display apparatus 10 according to various embodiments of the present disclosure may include vibration generating apparatuses 600a to 600e (600) disposed on the rear surface (or the backside surface) of the display panel 500 and energy harvesters 100a to 100e (100) disposed on the rear surface of the display panel 500. The energy harvester 100 may be attached on the rear surface of the display panel 500 by a first adhesive member 401. Also, the vibration generating apparatus 600 may be attached on the rear surface of the display panel 500 by a second adhesive member 650. The first adhesive member 401 and the second adhesive member 650 may include an adhesive or a double-sided tape, but embodiments of the present disclosure are not limited thereto. For example, one or more of the first adhesive member 401 and the second adhesive member 650 may include one of epoxy, acryl, silicone, and urethane, but embodiments of the present disclosure are not limited thereto. For example, one or more of the first adhesive member 401 and the second adhesive member 650 may further include an additive such as a hardener, a tackifier, a wax component, or an antioxidant or the like. The first adhesive member 401 and the second adhesive member 650 may include the same material, or may include different materials.

The vibration generating apparatus 600 may be implemented as a vibration apparatus which includes a film type or a voice coil. When the vibration generating apparatus 600 is implemented as a film type, the vibration generating apparatus 600 may have a thickness which is thinner than the display panel 500, and thus, a thickness of the display panel 500 may not increase due to the arrangement of the vibration generating apparatus 600. The vibration generating apparatus 600 may be use the display panel 500 as a vibration panel (or a vibration plate). For example, a film type vibration apparatus may include a piezoelectric device. The piezoelectric device may include a material having a piezoelectric characteristic. For example, the material having the piezoelectric characteristic may include one of PZT, PMN—PT, PZN—PT, BaTiO₃, and a Na—K—Nb (NKN)-based material, but embodiments of the present disclosure are not limited thereto. As another example, the material having the piezoelectric characteristic may include at least one of polymer materials such as PVDF, but embodiments of the present disclosure are not limited thereto. For example, a vibration apparatus including a voice coil may be a vibration apparatus which includes a magnet, a bobbin, and a coil wound around the bobbin. For example, the vibration apparatus may further include a frame (or a plate), a center pole, and a damper. The magnet (or a permanent magnet) may be disposed on a frame so as to be accommodated into a hollow portion of the bobbin. The coil may be wound to surround an outer perimeter surface of the bobbin. For example, the coil may be supplied with a sound signal (or a voice signal) from the outside. The coil may be raised and lowered along with elevation of the bobbin. When the sound signal is applied to the coil, the bobbin may vibrate (for example, a vertical reciprocating motion) according to Fleming's left hand rule based on an application magnetic field generated around the coil and an external magnetic field generated around the magnet. The center pole may be disposed on the magnet and may guide a vibration of the bobbin. For example, the center pole may be inserted (or accommodated) into the hollow portion of the bobbin, and thus, may be surrounded by the bobbin. For example, the center pole may be disposed on the magnet so as to be accommodated into the hollow portion of the bobbin. For example, the damper may be disposed between the frame and the bobbin. The damper may have a creased structure between one side and the other side thereof, and thus, may be contracted and relaxed based on a vibration of the bobbin. For example, the damper may limit a vibration distance (for example, a vertical movement distance) of the bobbin through a restoring force. For example, when the bobbin vibrates by a certain distance or more or vibrates by a certain distance or less, the bobbin may be restored to an original position by a restoring force of the damper. A configuration of the vibration apparatus including the coil is not limited thereto. For example, the vibration generating apparatus 600 may be referred to as a sound generating module, a sound generating apparatus, an actuator, a piezoelectric composite actuator, a speaker, a piezoelectric speaker, a piezoelectric composite speaker, and a haptic generating apparatus, but the terms are not limited thereto.

The energy harvester 100 may be implemented with at least one piezoelectric member for generating electrical energy based on deformation, or may be implemented by a combination of at least one piezoelectric member and at least one magnetostriction member having a shape capable of being deformed by a magnetic field. In a case where the energy harvester 100 is implemented in a form where a piezoelectric member is coupled (or connected) to a magnetostriction member, the energy harvester 100 may generate electrical energy based on a vibration of the display panel 500, and moreover, the piezoelectric member may be additionally deformed based on deformation of the magnetostriction member by a magnetic field, thereby additionally generating electrical energy. For example, the energy harvester 100 may be disposed in a vibration region where the display panel 500 vibrates. Also, the energy harvester 100 may be disposed in a magnetic field region where a magnetic field is generated in the display apparatus 10.

Referring to FIGS. 6A and 6B, the vibration generating apparatuses 600a and 600b and the energy harvesters 100a and 100b may be disposed at one edge portion (or one periphery portion) or the other edge portion (or the other periphery portion) of the display panel 500. The vibration generating apparatuses 600a and 600b may be attached on the rear surface of the display panel 500 by a first adhesive member 650, and the energy harvesters 100a and 100b may be attached on the rear surface of the display panel 500 by a second adhesive member 401. The vibration generating apparatuses 600a and 600b may have a size which is relatively less than a total area of the display panel 500.

In the vibration generating apparatuses 600a and 600b and the energy harvesters 100a and 100b, as illustrated in FIG. 6A, the vibration generating apparatus 600a may be disposed at an outermost edge (or an outermost periphery) of the display panel 500, and the energy harvester 100a may be disposed at an edge (or an periphery) which is disposed more inward than the vibration generating apparatus 600a. Alternatively, as illustrated in FIG. 6B, the energy harvester 100b may be disposed at an outermost edge (or an outermost periphery) of the display panel 500, and the vibration generating apparatus 600b may be disposed at an edge (or an periphery) which is disposed more inward than the energy harvester 100b.

Referring to FIGS. 6C to 6E, the vibration generating apparatuses 600c, 600d, and 600e may be disposed at a center portion of the display panel 500, and energy harvesters 100-1c, 100-2c, 100-1d, 100-2d, 100-1e, and 100-2e may be disposed at one side and the other side of the display panel 500 with the vibration generating apparatuses 600c, 600d, and 600e therebetween. As illustrated in FIG. 6C, the vibration generating apparatus 600c may have a size corresponding to a total area of the display panel 500. As illustrated in FIGS. 6D and 6E, the vibration generating apparatuses 600d and 600e may have a size which is relatively less than the total area of the display panel 500.

In the vibration generating apparatuses 600c, 600d, and 600e and the energy harvesters 100-1c, 100-2c, 100-1d, 100-2d, 100-1e, and 100-2e, as illustrated in FIGS. 6C and 6D, the vibration generating apparatuses 600c and 600d may be disposed at a center portion of the display panel 500, and the energy harvesters 100-1c, 100-2c, 100-1d, and 100-2d may be disposed at both edges of the display panel 500 with the vibration generating apparatuses 600c and 600d therebetween. Alternatively, as illustrated in FIG. 6E, the vibration generating apparatus 600e may be disposed at a center portion of the display panel 500, and the energy harvesters 100-1e and 100-2e may be disposed at a center portion disposed with the vibration generating apparatus 600e therebetween.

FIGS. 7A to 7D are plan views illustrating an energy harvester and a vibration generating apparatus according to various embodiments of the present disclosure. FIG. 8 is a cross-sectional view taken along line II-II' of FIG. 7D.

Figure 7A:
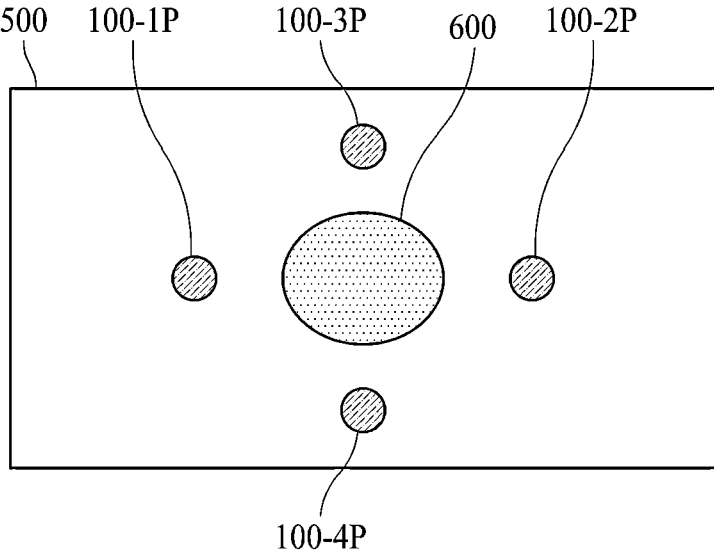
FIGS. 7A to 7D are plan views illustrating an energy harvester and a vibration generating apparatus according to various embodiments of the present disclosure.
Figure 8:
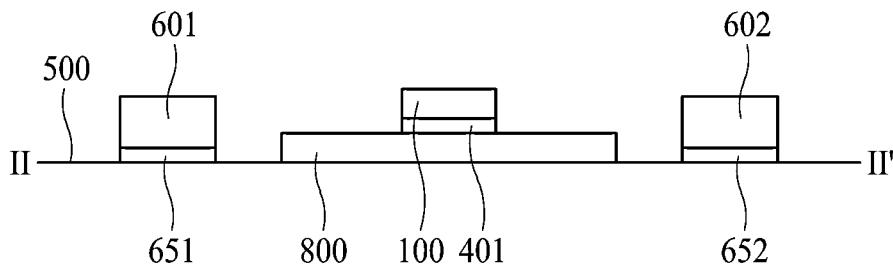
FIG. 8 is a cross-sectional view taken along line II-II' of FIG. 7D.

Referring to FIG. 7A, in the arrangement of energy harvesters 100-1P, 100-2P, 100-3P, and 100-4P and a vibration generating apparatus 600 according to various embodiments of the present disclosure, the vibration generating apparatus 600 may be disposed at a center portion of a display panel 500, the energy harvesters 100-1P, 100-2P, 100-3P, and 100-4P may be distributed to and disposed in a peripheral region of the vibration generating apparatus 600. The energy harvesters 100-1P, 100-2P, 100-3P, and 100-4P may be vertically coupled (or connected) to a plane of the display panel 500.

Figure 7B:
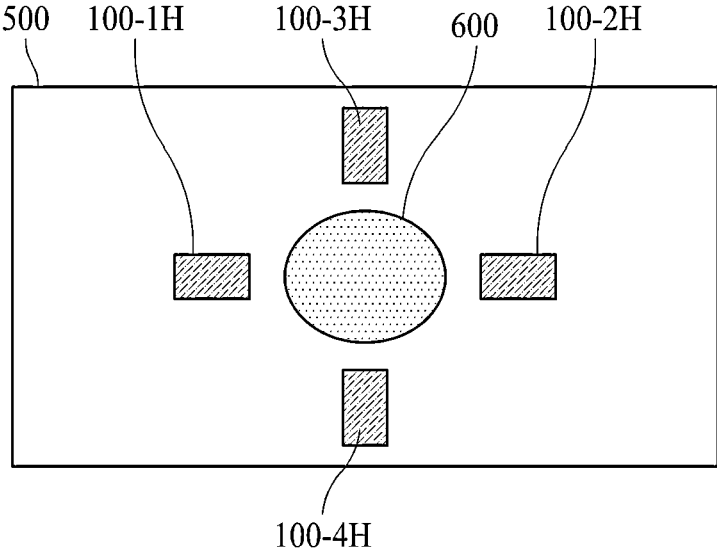

Referring to FIG. 7B, in the arrangement of energy harvesters 100-1H, 100-2H, 100-3H, and 100-4H and a vibration generating apparatus 600 according to various embodiments of the present disclosure, the vibration generating apparatus 600 may be disposed at a center portion of a display panel 500, the energy harvesters 100-1H, 100-2H, 100-3H, and 100-4H may be distributed to and disposed in a peripheral region of the vibration generating apparatus 600. The energy harvesters 100-1H, 100-2H, 100-3H, and 100-4H may be vertically coupled (or connected) to a plane of the display panel 500. Also, the energy harvesters 100-1H, 100-2H, 100-3H, and 100-4H may be arranged in a direction in which one side (or one portion) thereof is vertical to the vibration generating apparatus 600.

Figure 7C:
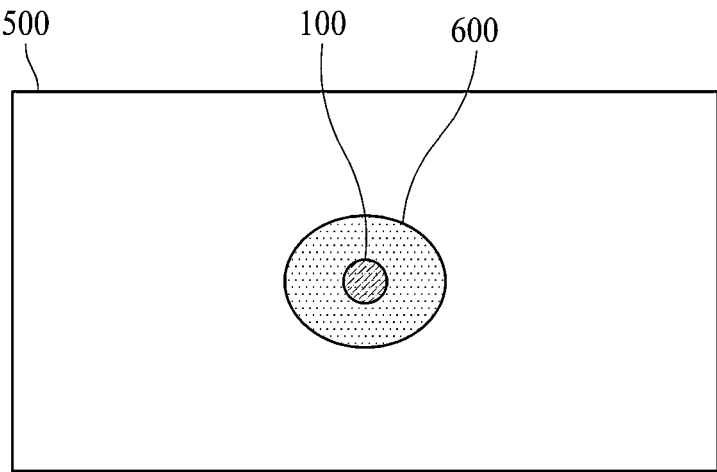

Referring to FIG. 7C, according to various embodiments of the present disclosure, a vibration generating apparatus 600 may be disposed on a display panel 500, and an energy harvester 100 may be disposed on a top surface (or an upper surface) of the vibration generating apparatus 600.

Figure 7D:
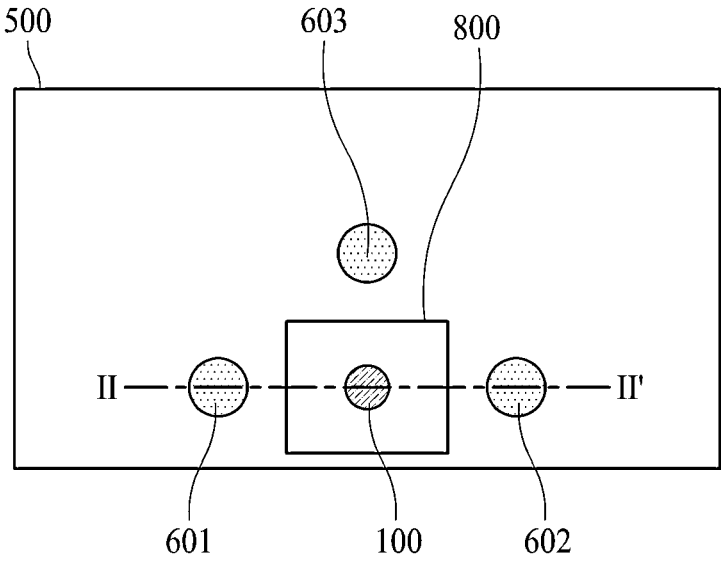

Referring to FIG. 7D, according to various embodiments of the present disclosure, an energy harvester 100 may be disposed on a printed circuit board (PCB) 800 disposed on a display panel 500, and vibration generating apparatuses 601, 602, and 603 may be disposed near the PCB 800. In a case where the energy harvester 100 is disposed on the PCB 800, electrical energy may be generated by vibrations transferred by the vibration generating apparatuses 601, 602, and 603 disposed near the PCB 800. Also, electrical energy may be generated from a magnetic field generated by the PCB 800. For example, a current may flow when the PCB 800 is driven, and thus, a magnetic field may be generated. Also, a magnetostriction material layer of the energy harvester 100 may be deformed by a magnetic field. A stress may be applied to a piezoelectric material layer of the energy harvester 100 based on deformation of a magnetostriction member, and thus, the piezoelectric material layer may generate electrical energy.

Figure 9:
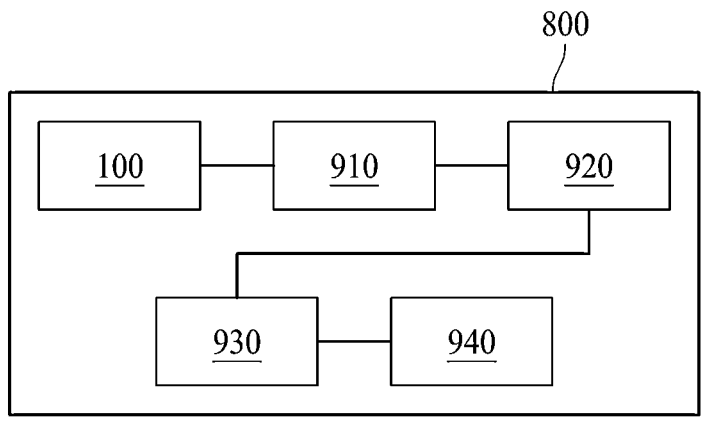
FIG. 9 is a block diagram of a printed circuit board according to various embodiments of the present disclosure.
Figure 10:
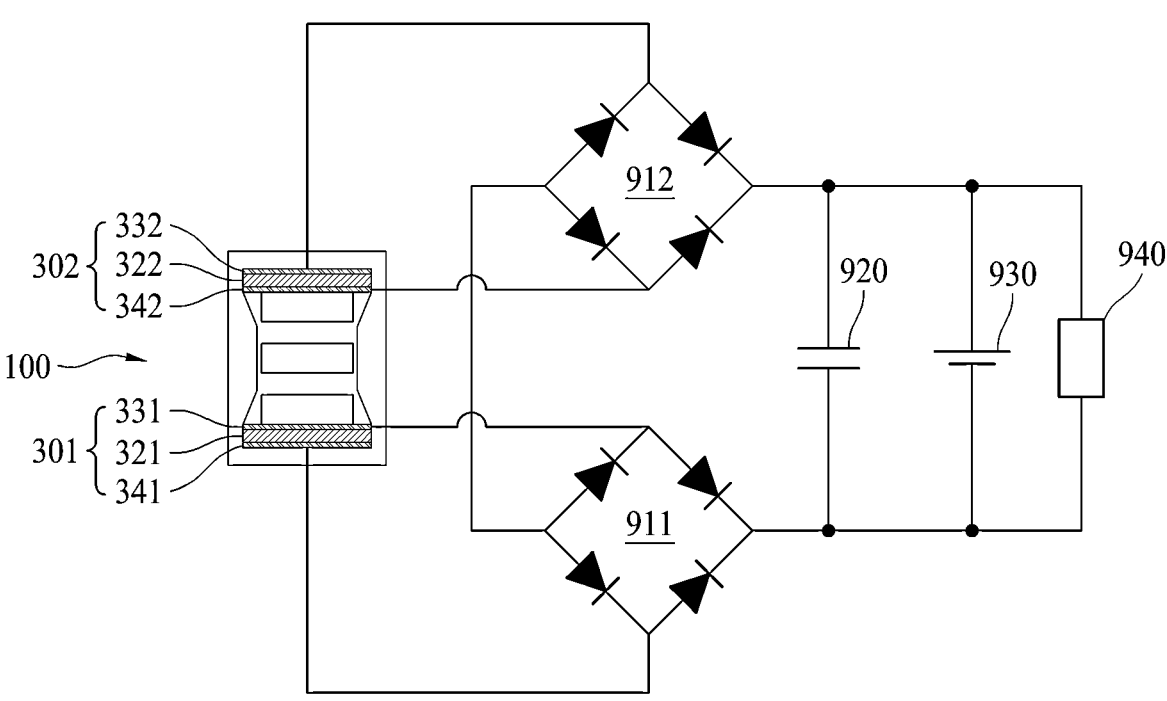
FIG. 10 illustrates a driving circuit connected to an energy harvester according to various embodiments of the present disclosure.

FIG. 9 is a block diagram of a PCB according to various embodiments of the present disclosure. FIG. 10 illustrates a driving circuit connected to an energy harvester according to various embodiments of the present disclosure.

Referring to FIGS. 9 and 10, the PCB 800 may include a rectifier 910, a capacitor 920, a first driving element 930, and a second driving element 940.

The energy harvester 100 according to various embodiments of the present disclosure may be disposed on a display panel 500, or as illustrated in FIG. 9, may be disposed on the PCB 800.

An output terminal of the energy harvester 100 may be connected to the rectifier 910. For example, as illustrated in FIG. 10, the energy harvester 100 may include a first power generating device part 301 and a second power generating device part 302. A first electrode layer 331 of the first power generating device part 301 may be connected to one end (or one side or one portion) of the first rectifier 911 and a second electrode layer 341 of the first power generating device part 301 may be connected to the other end (or the other side or the other portion) of the first rectifier 911. A first electrode layer 332 of the second power generating device part 302 may be connected to one end (or one side or one portion) of the second rectifier 912, and a second electrode layer 342 of the second power generating device part 302 may be connected to the other end (or the other side or the other portion) of the second rectifier 912. Electrical energy generated from the energy harvester 100 may be an alternating current (AC) voltage. Accordingly, the AC voltage may be converted into a direct current (DC) voltage through the rectifier 910, and the DC voltage may be transferred to the capacitor 920.

The capacitor 920 may store the electrical energy generated by the energy harvester 100. Also, the capacitor 920 may transfer the stored electrical energy to the first and second driving elements 930 and 940. For example, the capacitor 920 may be connected to the driving elements 930 and 940 in parallel. Alternatively, only the first driving element 930 may be connected to the capacitor 920, or only the second driving element 940 may be connected to the capacitor 920.

The first driving element 930 and the second driving element 940 may be supplied with the electrical energy from the capacitor 920 and may be driven. The first driving element 930 and the second driving element 940 may be connected to each other in parallel. The first driving element 930 and the second driving element 940 may be driven by the electrical energy generated from the energy harvester 100.

The first driving element 930 may be a passive element, and the second driving element 940 may be an active element. The passive element may include a resistor, a capacitor, a diode, and a battery. Also, the active element may include a wireless sensor having a function of transferring and receiving data. However, embodiments of the present disclosure are not limited thereto, and one of the first driving element 930 and the second driving element 940 may be omitted.

For example, the first driving element 930 may be a battery, and the second driving element 940 may be a wireless sensor. The first driving element 930 may be connected to the capacitor 920 in parallel and may be charged with electrical energy transferred from the capacitor 920. The first driving element 930 may be connected to the second driving element 940 in parallel and may supply power to the second driving element 940. Accordingly, the second driving element 940 may be driven with the electrical energy generated from the energy harvester 100.

A vibration generating apparatus according to an embodiment of the present disclosure may be applied to a vibration apparatus provided in an apparatus. An apparatus according to an embodiment of the present disclosure may be applied to mobile devices, video phones, smart watches, watch phones, wearable devices, foldable devices, rollable devices, bendable devices, flexible devices, curved devices, portable multimedia players (PMPs), personal digital assistants (PDAs), electronic organizers, desktop personal computers (PCs), laptop PCs, netbook computers, workstations, navigation devices, automotive navigation devices, automotive display apparatuses, automotive apparatuses, cinema display apparatuses, cinema apparatuses, televisions (TVs), wall paper display apparatuses, signage devices, game machines, notebook computers, monitors, cameras, camcorders, home appliances, etc. Also, the vibration generating module according to an embodiment of the present disclosure may be applied to organic light emitting lighting devices or inorganic light emitting lighting devices. In a case where the vibration generating apparatus is applied to a lighting device, the vibration generating apparatus may act as lighting and a speaker. Also, in a case where the vibration generating apparatus according to an embodiment of the present disclosure is applied to a mobile device, the vibration generating apparatus may be one or more of a speaker, a receiver, and a haptic, but embodiments of the present disclosure are not limited thereto.

An energy harvester and a display apparatus including the same according to various embodiments of the present disclosure will be described below.

An energy harvester according to various embodiments of the present disclosure may include a housing including an inner space holed in a lengthwise direction, a first magnet portion disposed at a center portion of the inner space of the housing, a second magnet portion spaced apart from the first magnet portion in the inner space, the second magnet portion including a first surface having a magnetic repulsive force with the first magnet portion, and a power generating device part disposed on a second surface of the second magnet portion and configured to generate electrical energy based on deformation thereof According to various embodiments of the present disclosure, the first magnet portion may vibrate based on an external vibration in the inner space, a vibration of the first magnet portion may be transferred to the second magnet portion by the magnetic repulsive force, and the power generating device part may be deformed by the vibration transferred to the second magnet portion.

According to various embodiments of the present disclosure, a separation distance between the first magnet portion and the second magnet portion may be maintained by the magnetic repulsive force.

According to various embodiments of the present disclosure, the inner space of the housing may include a first region where the first magnet portion is disposed at the center portion and the first surface of the second magnet portion spaced apart from the first magnet portion is disposed, a second region where the second magnet portion is disposed, and the second region comprises a slope surface where the inner space is widened progressively in a direction distancing from the first region.

According to various embodiments of the present disclosure, a first surface of the power generating device part may be coupled to the second surface of the second magnet portion, and a second surface of the power generating device part may be connected to one side or the other side of the housing with the inner space of the housing therebetween.

According to various embodiments of the present disclosure, an area of the first surface of the power generating device part may be greater than an area of the second surface of the second magnet portion.

According to various embodiments of the present disclosure, the power generating device part may include at least one piezoelectric member.

According to various embodiments of the present disclosure, the at least one piezoelectric member may include a first electrode layer, a piezoelectric material layer disposed on the first electrode layer, and a second electrode layer disposed on the piezoelectric material layer.

According to various embodiments of the present disclosure, the first electrode layer may be coupled to the second surface of the second magnet portion by a first adhesive layer, and the second electrode layer may be coupled to one side or the other side of the housing.

According to various embodiments of the present disclosure, the power generating device part may further include at least one magnetostriction member.

According to various embodiments of the present disclosure, the at least one magnetostriction member may be disposed according to one of the following manners being disposed between the second magnet portion and the at least one piezoelectric member, being disposed between the at least one piezoelectric member and one side or the other side of the housing, being disposed at each of both sides of the housing with the at least one piezoelectric member therebetween, and being disposed between a first piezoelectric member and a second piezoelectric member of the at least one piezoelectric member.

According to various embodiments of the present disclosure, a first surface of the at least one magnetostriction member may be coupled to the second surface of the second magnet portion by a first adhesive layer, and a second surface of the at least one magnetostriction member may be coupled to the at least one piezoelectric member by a second adhesive layer.

According to various embodiments of the present disclosure, a first surface of the at least one magnetostriction member may be coupled to the at least one piezoelectric member by a third adhesive layer, and a second surface of the at least one magnetostriction member may be coupled to the one side or the other side of the housing.

According to various embodiments of the present disclosure, the at least one magnetostriction member may include a first magnetostriction member and a second magnetostriction member, a first surface of the first magnetostriction member may be coupled to the second surface of the second magnet portion by a first adhesive layer, a second surface of the first magnetostriction member may be coupled to a first surface of the at least one piezoelectric member by a second adhesive layer, a first surface of the second magnetostriction member may be coupled to a second surface of the at least one piezoelectric member by a third adhesive layer, and a second surface of the second magnetostriction member may be coupled to the one side or the other side of the housing.

According to various embodiments of the present disclosure, a first surface of the at least one magnetostriction member may be coupled to the first piezoelectric member by a first adhesive layer, and a second surface of the at least one magnetostriction member may be coupled to the second piezoelectric member by a second adhesive layer.

According to various embodiments of the present disclosure, the power generating device part may include a first power generating device part disposed at the one side of the housing, and a second power generating device part disposed at the other side of the housing, and the second magnet portion may include a 2-1$^{st}$ magnet portion disposed between the first power generating device part and the first magnet portion, and a 2-2$^{nd}$ magnet portion disposed between the second power generating device part and the second magnet portion.

According to various embodiments of the present disclosure, may further include a vibration panel vibrating in a vertical or horizontal direction, and the housing may be connected to the vibration panel so that the lengthwise direction corresponds to a vibration direction of the vibration panel.

A display apparatus according to various embodiments of the present disclosure may include a display panel, a vibration generating apparatus disposed in the display panel, the vibration generating apparatus including at least one vibration module vibrating the display panel, the energy harvester disposed in a vibration region of the display panel according to embodiments of the present disclosure, and an energy device supplied with electrical energy generated by the energy harvester.

According to various embodiments of the present disclosure, may further include a rectification element between the energy harvester and the energy device, wherein the energy device comprises at least one of a passive element, an active element, and a driving element.

According to various embodiments of the present disclosure, the energy harvester may be disposed in a magnetic field region of the display panel.

A display apparatus according to various embodiments of the present disclosure may include a display panel, a vibration generating apparatus disposed near a printed circuit board on the display panel, the energy harvester disposed on the printed circuit board and defined in according to embodiments of the present disclosure, and an energy device supplied with electrical energy generated by the energy harvester.

According to various embodiments of the present disclosure, electrical energy may be generated by vibrations transferred by the vibration generating apparatus.

According to various embodiments of the present disclosure, the magnetostriction member of the energy harvester may be deformed by a magnetic field generated while the printed circuit board is driven. The piezoelectric material layer of the energy harvester may be applied a stress by the deformation of the magnetostriction member and then generates electrical energy.

The energy harvester and the display apparatus including the same according to embodiments in the energy harvester and the display apparatus including the same of the present disclosure may generate electrical energy with an electrical field and may enhance an efficiency of generating electrical energy based on an external vibration by a magnetic repulsive force between permanent magnets.

It will be apparent to those skilled in the art that various modifications and variations can be made in the present disclosure without departing from the scope of the disclosure. Thus, it is intended that the present disclosure cover the modifications and variations of this disclosure provided they come within the scope of the appended claims and their equivalents.

What is claimed is:

1. An energy harvester, comprising:
a housing including an inner space holed in a lengthwise direction;
a first magnet portion disposed at a center portion of the inner space of the housing;
a second magnet portion spaced apart from the first magnet portion in the inner space, the second magnet portion including a first surface having a magnetic repulsive force with the first magnet portion; and
a power generating device part disposed on a second surface of the second magnet portion and configured to generate electrical energy based on deformation of the power generating device part,
wherein the housing comprises a sloped inner surface so that the inner space is widened in a direction away from the center portion of the inner space.

2. The energy harvester of claim 1, wherein the first magnet portion vibrates based on an external vibration in the inner space, a vibration of the first magnet portion is transferred to the second magnet portion by the magnetic repulsive force, and the power generating device part is deformed by the vibration transferred to the second magnet portion.

3. The energy harvester of claim 1, wherein a separation distance between the first magnet portion and the second magnet portion is maintained by the magnetic repulsive force.

4. The energy harvester of claim 1, wherein:
the inner space of the housing comprises:
a first region where the first magnet portion is disposed at the center portion and the first surface of the second magnet portion spaced apart from the first magnet portion is disposed; and
a second region where the second magnet portion is disposed, and
the housing comprises the sloped inner surface at the second region where the inner space is widened progressively in a direction distancing from the first region.

5. The energy harvester of claim 1, wherein:

a first surface of the power generating device part is coupled to the second surface of the second magnet portion, and a second surface of the power generating device part is connected to one side of the housing or the other side of the housing, with the inner space of the housing being between the one side and the other side of the housing.

6. The energy harvester of claim 5, wherein an area of the first surface of the power generating device part is greater than an area of the second surface of the second magnet portion.

7. The energy harvester of claim 1, wherein the power generating device part comprises at least one piezoelectric member.

8. The energy harvester of claim 7, wherein the at least one piezoelectric member comprises:

a first electrode layer;

a second electrode layer; and a piezoelectric material layer disposed between the first electrode layer and the second electrode layer.

9. An energy harvester, comprising:

a housing including an inner space holed in a lengthwise direction;

a first magnet portion disposed at a center portion of the inner space of the housing;

a second magnet portion spaced apart from the first magnet portion in the inner space, the second magnet portion including a first surface having a magnetic repulsive force with the first magnet portion; and a power generating device part disposed on a second surface of the second magnet portion and configured to generate electrical energy based on deformation of the power generating device part, wherein the power generating device part comprises at least one piezoelectric member, wherein the at least one piezoelectric member comprises:

a first electrode layer;

a second electrode layer; and a piezoelectric material layer disposed between the first electrode layer and the second electrode layer, wherein the first electrode layer is coupled to the second surface of the second magnet portion by a first adhesive layer, and wherein the second electrode layer is coupled to one side of the housing or the other side of the housing.

10. The energy harvester of claim 7, wherein the power generating device part further comprises at least one magnetostriction member.

11. The energy harvester of claim 10, wherein the at least one magnetostriction member is disposed according to one of the following manners:

being disposed between the second magnet portion and the at least one piezoelectric member, being disposed between the at least one piezoelectric member and one side of the housing or the other side of the housing opposite the one side of the housing, being disposed at each of both sides of the housing with the at least one piezoelectric member therebetween, and being disposed between a first piezoelectric member and a second piezoelectric member of the at least one piezoelectric member.

12. The energy harvester of claim 11, wherein;

a first surface of the at least one magnetostriction member is coupled to the second surface of the second magnet portion by a first adhesive layer, and a second surface of the at least one magnetostriction member is coupled to the at least one piezoelectric member by a second adhesive layer.

13. The energy harvester of claim 11, wherein:

a first surface of the at least one magnetostriction member is coupled to the at least one piezoelectric member by a third adhesive layer, and a second surface of the at least one magnetostriction member is coupled to the one side or the other side of the housing.

14. The energy harvester of claim 11, wherein;

the at least one magnetostriction member comprises a first magnetostriction member and a second magnetostriction member, a first surface of the first magnetostriction member is coupled to the second surface of the second magnet portion by a first adhesive layer, a second surface of the first magnetostriction member is coupled to a first surface of the at least one piezoelectric member by a second adhesive layer, a first surface of the second magnetostriction member is coupled to a second surface of the at least one piezoelectric member by a third adhesive layer, and a second surface of the second magnetostriction member is coupled to the one side or the other side of the housing.

15. The energy harvester of claim 11, wherein:

a first surface of the at least one magnetostriction member is coupled to the first piezoelectric member by a first adhesive layer, and a second surface of the at least one magnetostriction member is coupled to the second piezoelectric member by a second adhesive layer.

16. The energy harvester of claim 1, wherein:

the power generating device part is in the inner space and comprises:

a first power generating device part disposed at one side of the housing; and a second power generating device part disposed at the other side of the housing opposite the one side of the housing, and the second magnet portion comprises:

a $2\text{-}1^{st}$ magnet portion disposed between the first power generating device part and the first magnet portion; and a $2\text{-}2^{nd}$ magnet portion disposed between the second power generating device part and the second magnet portion.

17. The energy harvester of claim 1, further comprising a vibration panel vibrating in a vertical or horizontal direction, wherein the housing is connected to the vibration panel so that the lengthwise direction corresponds to a vibration direction of the vibration panel.

18. A display apparatus, comprising:

a display panel;

a vibration generating apparatus disposed in the display panel, the vibration generating apparatus including at least one vibration module vibrating the display panel;

the energy harvester of claim 1 disposed in a vibration region of the display panel; and an energy device supplied with electrical energy generated by the energy harvester.

19. The display apparatus of claim 18, further comprising a rectification element between the energy harvester and the energy device, wherein the energy device comprises at least one of a passive element, an active element, and a driving element.

20. The display apparatus of claim 18, wherein the energy harvester is disposed in a magnetic field region of the display panel.

21. A display apparatus, comprising:

a display panel;

a vibration generating apparatus disposed near a printed circuit board on the display panel;

the energy harvester of claim 10 disposed on the printed circuit board; and an energy device supplied with electrical energy generated by the energy harvester.

22. The display apparatus of claim 21, wherein the electrical energy is generated based on vibrations transferred by the vibration generating apparatus to the energy harvester.

23. The display apparatus of claim 21, wherein;

the at least one magnetostriction member of the energy harvester is deformed by a magnetic field generated while the printed circuit board is driven, and the at least one piezoelectric member of the energy harvester is applied a stress by the deformation of the at least one magnetostriction member and then generates the electrical energy.

\* \* \* \* \*